(12) United States Patent
Mizusaki

(10) Patent No.: US 12,527,213 B2
(45) Date of Patent: Jan. 13, 2026

(54) LIGHT-EMITTING ELEMENT AND LIGHT-EMITTING DEVICE

(71) Applicant: SHARP KABUSHIKI KAISHA, Sakai (JP)

(72) Inventor: Masanobu Mizusaki, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 933 days.

(21) Appl. No.: 17/771,936

(22) PCT Filed: Nov. 12, 2019

(86) PCT No.: PCT/JP2019/044425
§ 371 (c)(1),
(2) Date: Apr. 26, 2022

(87) PCT Pub. No.: WO2021/095145
PCT Pub. Date: May 20, 2021

(65) Prior Publication Data
US 2022/0384754 A1    Dec. 1, 2022

(51) Int. Cl.
| | |
|---|---|
| *H01L 51/54* | (2006.01) |
| *H10K 50/11* | (2023.01) |
| *H10K 50/155* | (2023.01) |
| *H10K 85/10* | (2023.01) |
| *H10K 85/60* | (2023.01) |
| *H10K 50/15* | (2023.01) |
| *H10K 59/12* | (2023.01) |
| *H10K 59/35* | (2023.01) |
| *H10K 101/40* | (2023.01) |

(52) U.S. Cl.
CPC ............ *H10K 85/10* (2023.02); *H10K 50/11* (2023.02); *H10K 50/155* (2023.02); *H10K 85/631* (2023.02); *H10K 85/6572* (2023.02); *H10K 50/15* (2023.02); *H10K 59/12* (2023.02); *H10K 59/35* (2023.02); *H10K 2101/40* (2023.02)

(58) Field of Classification Search
None
See application file for complete search history.

(56) References Cited

U.S. PATENT DOCUMENTS

| | | |
|---|---|---|
| 2012/0261653 A1 | 10/2012 | Okamoto |
| 2013/0153881 A1 | 6/2013 | Tokoo et al. |
| 2015/0060828 A1 | 3/2015 | Sago et al. |
| 2016/0141506 A1 | 5/2016 | Miyashita et al. |
| 2020/0168829 A1 | 5/2020 | Hattori et al. |

FOREIGN PATENT DOCUMENTS

| | | |
|---|---|---|
| JP | H08222373 A | 8/1996 |
| JP | 2005285617 A | 10/2005 |
| JP | 2014003247 A | 1/2014 |
| JP | 2015050094 A | 3/2015 |
| JP | 2016094373 A | 5/2016 |
| WO | 2011/065137 A1 | 6/2011 |
| WO | 2012/039213 A1 | 3/2012 |
| WO | 2019/039562 A1 | 2/2019 |

*Primary Examiner* — Andrew K Bohaty
(74) *Attorney, Agent, or Firm* — ScienBiziP, P.C.

(57) ABSTRACT

A light-emitting element includes at least: an anode; a cathode; a light-emitting layer between the anode and the cathode; and a hole-transport layer between the anode and the light-emitting layer. The hole-transport layer is a film containing a mixture of a hole-transport material and a polysiloxane-based polymer. The light-emitting element further includes: a first electron-transport layer between the light-emitting layer and the cathode; and a second electron-transport layer between the first electron-transport layer and the cathode. A value of a LUMO level of the first electron-transport layer is as high as, or higher than, a value of a LUMO level of the second electron-transport layer, and the value of the LUMO level of the first electron-transport layer is higher than a value of a LUMO level of the light-emitting layer in contact with the first electron-transport layer.

20 Claims, 9 Drawing Sheets

LIGHT-EMITTING ELEMENT AND LIGHT-EMITTING DEVICE

TECHNICAL FIELD

The disclosure relates to a light-emitting element, and a light-emitting device including the light-emitting element.

BACKGROUND ART

Patent Document 1 relates to an organic light-emitting apparatus including organic layers between electrodes, and discloses a technique of adding a dopant to each of the organic layers in order to increase efficiency in emission of light from a light-emitting layer and reduce deterioration of the light-emitting layer.

CITATION LIST

Patent Literature

[Patent Document 1] Re-publication of PCT International Publication No. WO2012-039213

SUMMARY OF INVENTION

Technical Problem

Even in the light-emitting apparatus described in Patent Document 1, the carriers, injected from the electrodes into the organic layers between the electrodes, would be either retained in the organic layers, or unevenly distributed in the light-emitting layer. Hence, the life of the light-emitting apparatus is reduced.

Solution to Problem

In order to solve the above problem, a light-emitting element according to the disclosure includes: an anode; a cathode; a light-emitting layer between the anode and the cathode; and a hole-transport layer between the anode and the light-emitting layer, wherein the hole-transport layer is a film containing a mixture of a polysiloxane-based polymer and a hole-transport material.

Moreover, in order to solve the above problem, a light-emitting element according to the disclosure includes: an anode; a cathode; and a hole-transport layer, a light-emitting layer, a first electron-transport layer, and a second electron-transport layer sandwiched between the anode and the cathode and provided in a stated order from toward the anode, wherein a value of a LUMO level of the first electron-transport layer is as high as, or higher than, a value of a LUMO level of the second electron-transport layer, and the value of the LUMO level of the first electron-transport layer is higher than a value of a LUMO level of the light-emitting layer in contact with the first electron-transport layer.

Advantageous Effect of Invention

The above features can improve the balance of the carriers in the light-emitting layer to increase the life of a light-emitting element, and provide a light-emitting device including the light-emitting element.

DESCRIPTION OF EMBODIMENTS

First Embodiment

Figure 1:
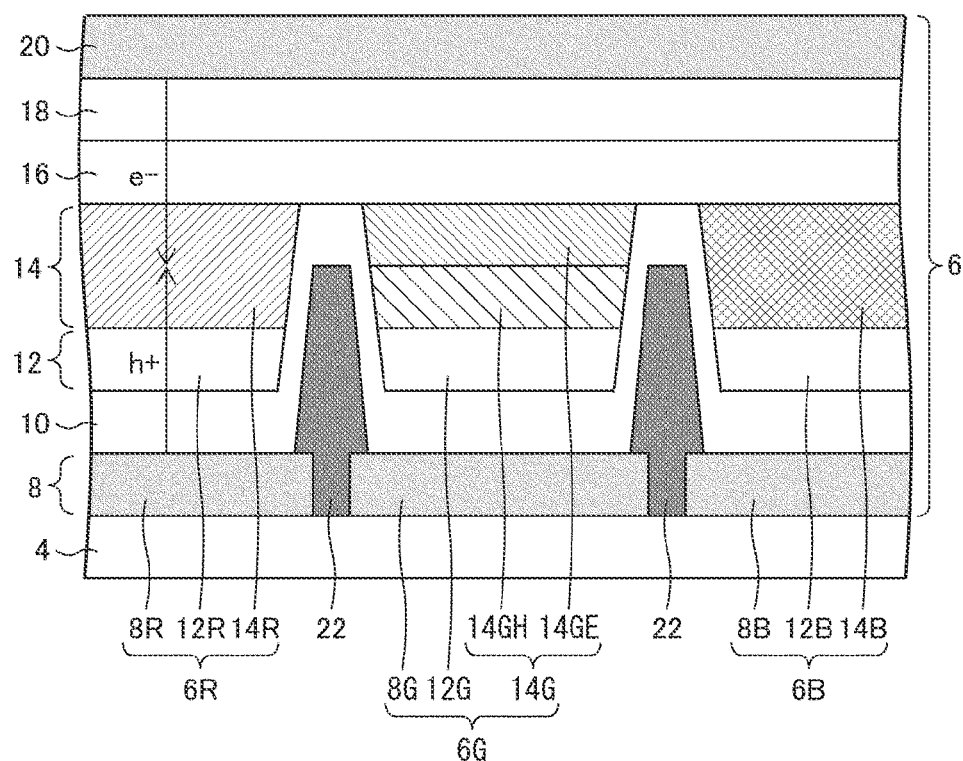
FIG. 1 is a schematic cross-sectional view of a light-emitting device according to a first embodiment of the disclosure.
Figure 2:
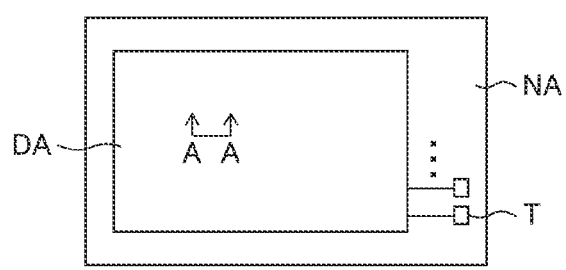
FIG. 2 is a schematic top view of the light-emitting device according to the first embodiment of the disclosure.

FIG. 2 is a schematic top view of a light-emitting device 2 according to this embodiment. FIG. 1 is a cross-sectional view along arrows A-A in FIG. 2.

FIG. 2 shows that the light-emitting device 2 according to this embodiment includes: a light-emitting region DA emitting light; and a frame region NA surrounding the light-emitting region DA. The frame region NA may include a terminal T formed to receive a signal for driving the light-emitting elements of the light-emitting device 2. The light-emitting elements will be described later.

In a position to overlap the light-emitting region DA in plan view, as illustrated in FIG. 1, the light-emitting device 2 according to this embodiment includes: an array substrate 4; and a light-emitting-element layer 6 on the array substrate 4. In particular, the light-emitting device 2 is structured to include the array substrate 4 formed of not-shown thin-film transistors (TFTs), and the light-emitting element 6 multi-layered and stacked on the array substrate 4. Note that, in DESCRIPTION, a direction from the light-emitting-element layer 6 toward the array substrate 4 in the light-emitting device 2 is referred to as a "downward direction", and a direction from the light-emitting-element layer 6 toward a light-emitting face in the light-emitting device 2 is referred to as an "upward direction".

The light-emitting-element layer 6 includes: an anode 8; a first hole-transport layer 10 and a second hole-transport layer 12 each acting as a hole-transport layer, a light-emitting layer 14; a first electron-transport layer 16 and a second electron-transport layer 18 each acting as an electron-transport layer, and a cathode 20, all of which are stacked in the stated order from below. The anode 8 is included in the light-emitting-element layer 6 formed above the array substrate 4. The anode 8 is electrically connected to the TFTs of the array substrate 4. Note that the light-emitting device 2 may include, in an upper portion of the cathode 20, either a capping layer or a sealing layer containing a seal material.

Note that, in this embodiment, each of the first hole-transport layer 10, the second hole-transport layer 12, the light-emitting layer 14, the first electron-transport layer 16, and the second electron-transport layer 18 is an organic layer containing an organic material.

In this embodiment, the light-emitting-element layer 6 includes: a light-emitting element 6R; a light-emitting element 6G; and a light-emitting element 6B. Each of the light-emitting element 6R, the light-emitting element 6G, and the light-emitting element 6B may be an OLED element; that is, an organic EL element in which the light-emitting layer 14 contains an organic fluorescent material or an organic phosphorescent material. Other than that, each of the light-emitting element 6R, the light-emitting element 6G, and the light-emitting element 6B may be a QLED element in which the light-emitting layer 14 contains semiconductor nanoparticle material; that is, a quantum-dot material. In this embodiment, however, the light-emitting element 6R, the light-emitting element 6G, and the light-emitting element 6B may not be limited to the OLED elements or the QLED elements, but may be various kinds of light-emitting elements.

Here, the anode 8, the second hole-transport layer 12 and the light-emitting layer 14 are divided by edge covers 22. In particular, in this embodiment, the anode 8 is divided by the edge covers 22 into: an anode 8R for the light-emitting element 6R; an anode 8G for the light-emitting element 6G; and an anode 8B for the light-emitting element 6B. Moreover, the second hole-transport layer 12 is divided by the edge covers 22 into: a second hole-transport layer 12R for the light-emitting element 6R; a second hole-transport layer 12G for the light-emitting element 6G; and a second hole-transport layer 12B for the light-emitting element 6B. Furthermore, the light-emitting layer 14 is divided by the edge covers 22 into: a light-emitting layer 14R; a light-emitting layer 14G; and a light-emitting layer 14B.

In addition, the light-emitting layer 14G includes a first light-emitting layer 14GH and a second light-emitting layer 14GE stacked on top of each other from toward the anode 8. The first light-emitting layer 14GH is a light-emitting layer capable of transporting holes, and the second light-emitting layer 14GE is a light-emitting layer capable of transporting electrons.

Note that the first hole-transport layer 10, the first electron-transport layer 16, the second electron-transport layer 18, and the cathode 20 are not divided by the edge covers 22, but are formed in common.

As illustrated in FIG. 1, the edge covers 22 may be positioned to cover side faces of, and circumferential end portions around top faces of, the anode 8.

In this embodiment, the light-emitting element 6R includes: the anode 8R; the first hole-transport layer 10; the second hole-transport layer 12R; the light-emitting layer 14R; the first electron-transport layer 16; the second electron-transport layer 18; and the cathode 20. Moreover, the light-emitting element 6G includes: the anode 8G; the first hole-transport layer 10; the second hole-transport layer 12G; the light-emitting layer 14G; the first electron-transport layer 16; the second electron-transport layer 18; and the cathode 20. Furthermore, the light-emitting element 6B includes: the anode 8B; the first hole-transport layer 10; the second hole-transport layer 12B; the light-emitting layer 14B; the first electron-transport layer 16; the second electron-transport layer 18; and the cathode 20.

In this embodiment, the light-emitting layer 14R, the light-emitting layer 14G, and the light-emitting layer 14B respectively emit red light, green light, and blue light. That is, the light-emitting element 6R, the light-emitting element 6G, and the light-emitting element 6B respectively emit red light, green light, and blue light.

Here, the blue light has a center wavelength in a wavelength band of, for example, 400 nm or more, and 500 nm or less. Moreover, the green light has a center wavelength in a wavelength band of, for example, more than 500 nm, and 600 nm or less. Furthermore, the red light has a center wavelength in a wavelength band of, for example, more than 600 nm, and 780 nm or less.

In this embodiment, the light-emitting layer 14R and the light-emitting layer 14B are in contact with: the second hole-transport layer 12 toward the anode 8; and the first electron-transport layer 16 toward the cathode 20. That is, the light-emitting layer 14R and the light-emitting layer 14B each formed into a single layer are in contact with both the second hole-transport layer 12 and the first electron-transport layer 16.

Meanwhile, the first light-emitting layer 14GH is in contact with: the second hole-transport layer 12 toward the anode 8; and the second light-emitting layer 14GE toward the cathode 20. Furthermore, the second light-emitting layer 14GE is in contact with: the first light-emitting layer 14GH toward the anode 8; and the first electron-transport layer 16 toward the cathode 20.

Note that the light-emitting device 2 according to this embodiment shall not be limited to the above configuration. Alternatively, the light-emitting device 2 may include another layer either between the second hole-transport layer 12 and the light-emitting layer 14, or between the light-emitting layer 14 and the first electron-transport layer 16.

The anode 8 and the cathode 20, containing a conductive material, are respectively and electrically connected to the first hole-transport layer 10 and the second electron-transport layer 18. Either the anode 8 or the cathode 20 whichever closer to the light-emitting face of the light-emitting device 2 is a translucent electrode.

The anode 8 contains, for example, a Ag—Pd—Cu alloy, and indium tin oxide (ITO) stacked on the alloy. The anode 8 in the above configuration is an electrode reflecting light emitted from the light-emitting layer 14. Hence, of the light emitted from the light-emitting layer 14, downward light is reflected by the anode 8.

Whereas, the cathode 20 contains, for example, a translucent Mg—Ag alloy. That is, the cathode 20 is an electrode transparent to light emitted from the light-emitting layer 14. Hence, of the light emitted from the light-emitting layer 14, upward light passes through the cathode 20. Hence, the light-emitting device 2 can release the light emitted upwards from the light-emitting layer 14.

As can be seen, in the light-emitting device 2, both the light emitted upwards and the light emitted downwards from the light-emitting layer 14 can be directed toward the cathode 20 (upwards). That is, the light-emitting device 2 is a top-emission light-emitting device.

Moreover, in this embodiment, the cathode 20, which is translucent, may partially reflect the light emitted from the light-emitting layer 14. In addition, in this embodiment, between the light-reflective anode 8 and the translucent cathode 20, an optical cavity may be formed for the light emitted from the light-emitting layer 14. The optical cavity formed between the anode 8 and the cathode 20 can improve chromaticity of the light emitted from the light-emitting layer 14.

Note that the configurations of the anode 8 and the cathode 20 described above are examples, and the anode 8 and the cathode 20 may have other configurations.

The light-emitting layer 14 causes recombination of holes transported from the anode 8 and electrons transported from the cathode 20 in order to emit light. Note that, in the light-emitting element 60, the holes transported to the first light-emitting layer 14GH and the electrons transported to the second light-emitting layer 14GE are transported to, and recombine together near, the interface between the first light-emitting layer 14GH and the second light-emitting layer 14GE.

The first hole-transport layer 10 and the second hole-transport layer 12 transport the holes from the anode 8 to the light-emitting layer 14. The second hole-transport layer 12 may also function to block transportation of the electrons from the cathode 20. The first electron-transport layer 16 and the second electron-transport layer 18 transport the electrons from the cathode 20 to the light-emitting layer 14. The first electron-transport layer 16 may also function to block transportation of the holes from the anode 8.

Figure 3:
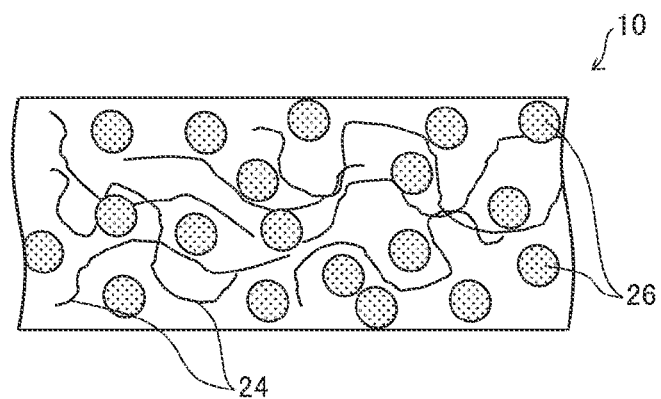
FIG. 3 is an enlarged cross-sectional view of a first hole-transport layer according to the first embodiment of the disclosure.

Described here with reference to FIG. 3 is a composition of the first hole-transport layer 10 according to this embodiment. FIG. 3 is an enlarged cross-sectional view of the first hole-transport layer 10 according to this embodiment.

As illustrated in FIG. 3, the first hole-transport layer 10 in this embodiment is a film containing a mixture of a polysiloxane-based polymer 24 and a hole-transport material 26.

The polysiloxane-based polymer 24 is higher in molecular rigidity and thermal resistance than typical acrylic polymers. In this embodiment, for example, the polysiloxane-based polymer 24 is a polymer expressed by a general formula (1) or a general formula (2) below.

[Formula 1]

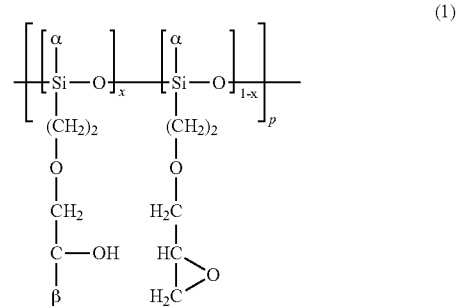

(1)

[Formula 2]

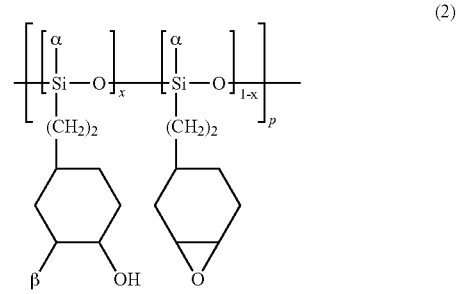

(2)

Wherein, x is a real number of 0 or more and 1 or less, p is an integer of 1 or more indicating degree of polymerization, a is a hydrogen group, a methyl group, an ethyl group, a methoxy group, an ethoxy group, an alkyl group where C is 3 or more and 6 or less, or an alkoxy group, and β is a saturated alkyl group, an unsaturated alkyl group, or a circular alkyl group where C is 3 or more and 6 or less.

Note that, the polysiloxane-based polymer 24 in this embodiment may also be a polymer in which at least one H of the saturated alkyle group β, the unsaturated alkyl group β, or the circular alkyl group β in the general formula (1) or the general formula (2) may be replaced with F or Cl.

The polysiloxane-based polymer 24 may also be a polymer expressed by a formula (3) or a formula (4) below.

[Formula 3]

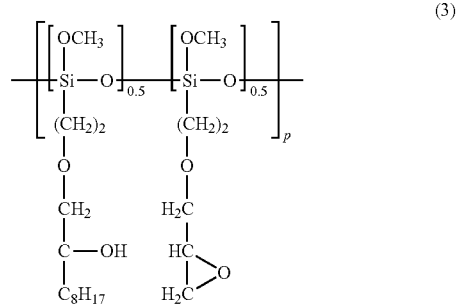

(3)

[Formula 4]

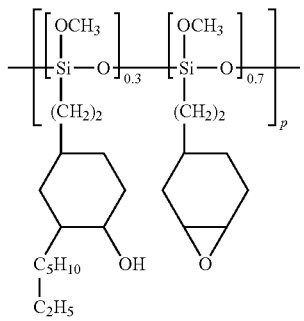

(4)

[Formula 6]

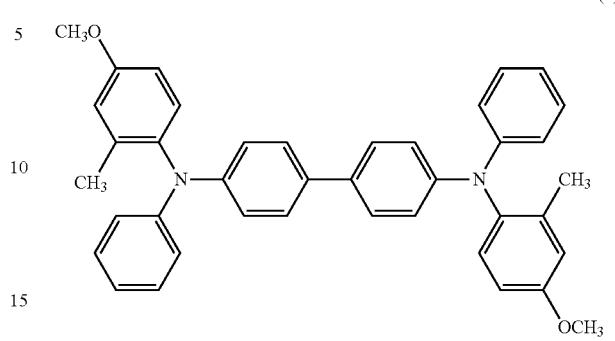

(6)

That is, the formula (3) expresses the polymer expressed by the general formula (1) where x is 0.5, α is $OCH_3$, and β is $C_8H_{17}$. Moreover, the formula (4) expresses the polymer expressed by the general formula (2) where x is 0.3, α is $OC_2H_5$, and β is $C_5H_{10}C_2F_5$.

The hole-transport material 26 is higher in molecular flexibility and hole conductivity than the polysiloxane-based polymer 24. In this embodiment, the hole-transport material 26 contains at least one of phenylamine or a carbazole-based compound. Moreover, the hole-transport material 26 preferably has a phenylamine-based skeleton.

Both phenylamine and the carbazole-based compound have a hole transport function. Hence, phenylamine and the carbazole-based compound contained in the hole-transport material 26 improve efficiency in transportation of the holes in the hole-transport material 26. Moreover, compared with a material having a carbazole-based skeleton, a material having the phenylamine-based skeleton is higher in flexibility, and thus is likely to encourage transportation of the holes. Moreover, compared with the material having the phenylamine-based skeleton, the material having the carbazole-based skeleton is higher in rigidity, and thus is likely to exhibit high thermal stability and heat resistance.

Specifically, the hole-transport material 26 may be N,N'-di-1-naphthyl-N,N'-diphenylbenzidine (NPD) expressed by Formula (5) below.

[Formula 5]

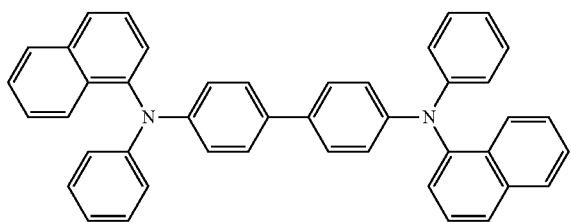

(5)

Alternatively, the hole-transport material 26 may be N,N-bis(4-methoxy-2-methylphenyl)-N,N'-diphenylbenzidine (BMMD) expressed by Formula (6) below.

The polysiloxane-based polymer 24 has an affinity for the hole-transport material 26. Hence, the film containing the mixture of the polysiloxane-based polymer 24 and the hole-transport material 26 is higher in homogeneity than a film containing a mixture of another polymer and the transport material 26. Moreover, the polysiloxane-based polymer 24 has a high affinity for the hole-transport material 26. Hence, the first hole-transport layer 10 can be formed by co-evaporation of the polysiloxane-based polymer 24 and the hole-transport material 26.

The first hole-transport layer 10, the second hole-transport layer 12, the light-emitting layer 14, the first electron-transport layer 16, and the second electron-transport layer 18 may be formed by such a known technique as vapor deposition using a shadow mask. In particular, as described above, the first hole-transport layer 10 can be formed by co-evaporation of the polysiloxane-based polymer 24 and the hole-transport material 26.

Note that the light-emitting device 2 according to this embodiment may include a not-shown hole-injection layer containing a hole-injection material and provided between the anode 8 and the first hole-transport layer 10. Likewise, the light-emitting device 2 according to this embodiment may include a not-shown electron-injection layer containing an electron-injection material and provided between the cathode 20 and the second electron-transport layer 18.

In this embodiment, the first hole-transport layer 10 is a film containing a mixture of: the polysiloxane-based polymer 24 highly resistant to heat; and the hole-transport material 26 greatly capable of transporting the holes. Compared with a known hole-transport layer that consists only of a hole-transport material, the first hole-transport layer 10 can exhibit higher heat resistance while maintaining sufficient hole transportation capability.

Hence, the light-emitting element 6R, the light-emitting element 6G, and the light-emitting element 6B, all of which include the first hole-transport layer 10, are high in resistance to a temperature rise that occurs when the light-emitting device 2 is driven. Specifically, the increasing resistance to the temperature rise further reduces deterioration of the first hole-transport layer 10 caused by the temperature rise that occurs when the light-emitting devices are driven. In the light-emitting elements, the above features reduce a decrease in efficiency in transportation of the holes from the anode 8 to the light-emitting layer 14.

Hence, the light-emitting device 2 according to this embodiment can reduce excessive electrons, and improve balance of the carriers, in the light-emitting layer 14. Hence, the light-emitting layer 14 reduces the risk of creating a period emitting no light due to the excessive electrons, thereby increasing the lives of the light-emitting elements.

Moreover, the first hole-transport layer 10 includes the polysiloxane-based polymer 24 with high heat resistance. Hence, in this embodiment, the light-emitting device 2 can reduce deterioration of the first hole-transport layer 10 when the light-emitting elements are driven at high temperature.

Note that, in view of sufficient molecular rigidity and heat resistance of the polysiloxane-based polymer 24, the polysiloxane-based polymer 24 preferably has a weight-average molecular weight of 5,000 or more. Moreover, in view of sufficient affinity of the polysiloxane-based polymer 24 for the hole-transport material 26, the polysiloxane-based polymer 24 preferably has a weight-average molecular weight of 65,000 or less. In other words, in the general formulae (1) and (2), and the formulae (3) and (4), a value of p is preferably 5,000 or more and 65,000 or less.

Furthermore, in view of sufficient heat resistance of the first hole-transport layer 10, a weight ratio of the polysiloxane-based polymer 24 to the hole-transport material 26 is preferably 1 to 1,000 or more. In addition, in view of sufficient hole transportation capability of the first hole-transport layer 10, a weight ratio of the polysiloxane-based polymer 24 to the hole-transport material 26 is preferably 1 to 1 or less.

Figure 4:
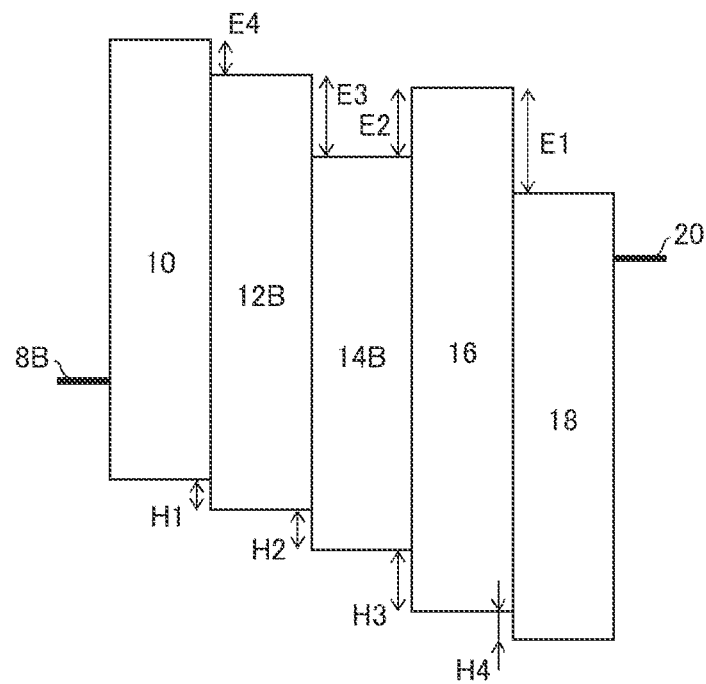
FIG. 4 illustrates an energy diagram showing an example of either a Fermi level of, or a LUMO level and a HOMO level of, each layer in a light-emitting element of the light-emitting device according to the first embodiment of the disclosure.
Figure 5:
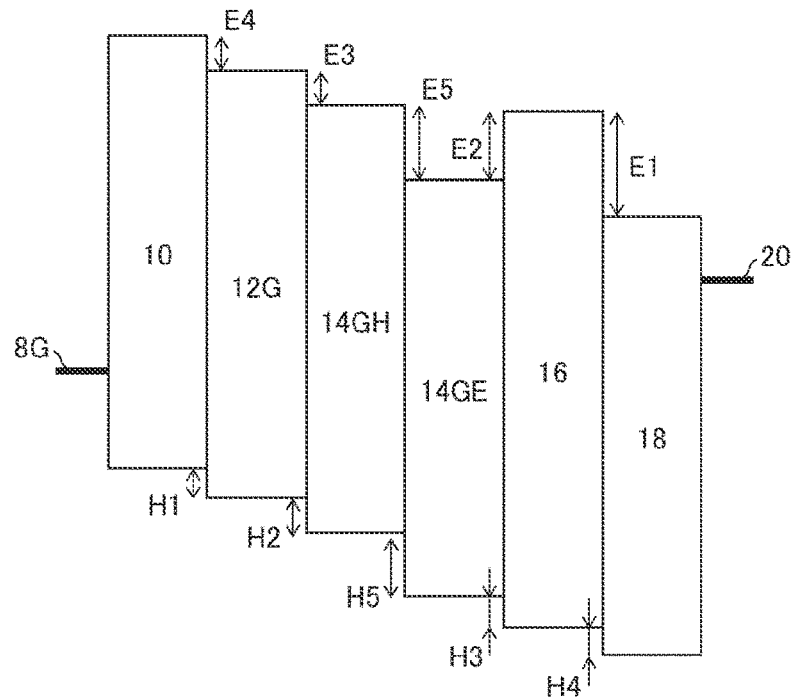
FIG. 5 illustrates an energy diagram showing an example of either a Fermi level of, or a LUMO level and a HOMO level of, each layer in another light-emitting element of the light-emitting device according to the first embodiment of the disclosure.
Figure 6:
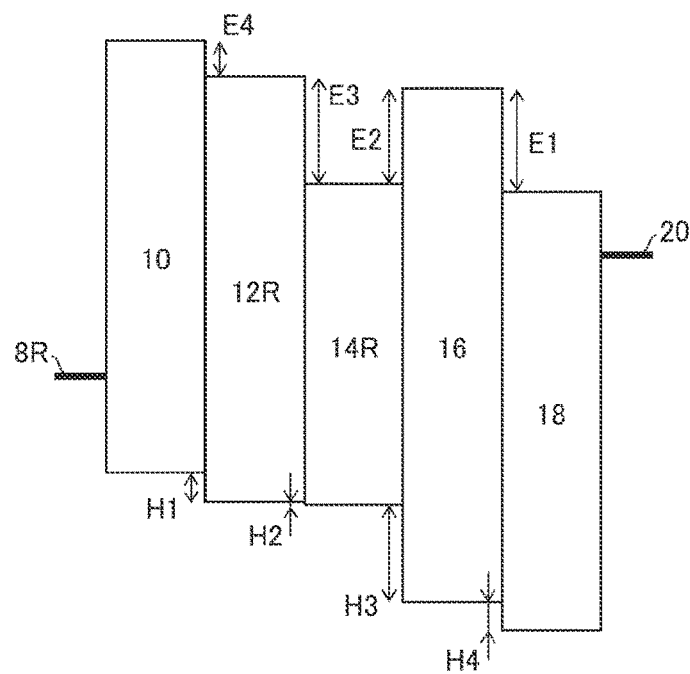
FIG. 6 illustrates an energy diagram showing an example of either a Fermi level of, or a LUMO level and a HOMO level of, each layer in another light-emitting element of the light-emitting device according to the first embodiment of the disclosure.

Described next with reference to FIGS. 4 to 6 is an energy band of each of the layers of the light-emitting elements included in the light-emitting-element layer 6 of the light-emitting device 2 according to this embodiment. FIG. 4 illustrates an energy band diagram showing an example of either a Fermi level of, or a bandgap of, each layer in the light-emitting element 6B of the light-emitting device 2 according to this embodiment. FIG. 5 illustrates an energy band diagram showing an example of either a Fermi level of, or a bandgap of, each layer in the light-emitting element 6G of the light-emitting device 2 according to this embodiment. FIG. 6 illustrates an energy band diagram showing an example of either a Fermi level of, or a bandgap of, each layer in the light-emitting element 6R of the light-emitting device 2 according to this embodiment.

Note that, in the energy band diagrams of DESCRIPTION, energy levels of the layers are represented with reference to a vacuum level. Moreover, in the energy band diagrams of DESCRIPTION, Fermi levels or bandgaps are those of members corresponding to the assigned reference numerals. The anode 8 and the cathode 20 are assigned Fermi levels. The first hole-transport layer 10, the second hole-transport layer 12, the light-emitting layer 14, the first electron-transport layer 16, and the second electron-transport layer 18 are each assigned a bandgap from a LUMO level to a HOMO level.

Described below with reference to FIGS. 4 to 6 is differences in HOMO level and LUMO level between the layers in the light-emitting-element layer 6 according to this embodiment. In DESCRIPTION, a difference obtained when a value of a HOMO level of a second layer is subtracted from a value of a HOMO level of a first layer is an energy level difference between the HOMO level of the first layer and the HOMO level of the second layer.

Meanwhile, in DESCRIPTION, a difference obtained when a value of a LUMO level of a first layer is subtracted from a value of LUMO level of a second layer is an energy level difference between the LUMO level of the first layer and the LUMO level of the second layer.

In FIGS. 4 to 6, H1 indicates an energy level difference between a HOMO level of the first hole-transport layer 10 and a HOMO level of the second hole-transport layer 12 in each of the light-emitting elements. H2 indicates an energy level difference between a HOMO level of the second hole-transport layer 12 and a HOMO level of the light-emitting layer 14 in each of the light-emitting elements. H3 indicates an energy level difference between a HOMO level of the light-emitting layer 14 and a HOMO level of the first electron-transport layer 16 in each of the light-emitting elements. H4 indicates an energy level difference between a HOMO level of the first electron-transport layer 16 and a HOMO level of the second electron-transport layer 18 in each of the light-emitting elements.

Furthermore, in FIGS. 4 to 6, E1 indicates an energy level difference between a LUMO level of the second electron-transport layer 18 and a LUMO level of the first electron-transport layer 16 in each of the light-emitting elements. E2 indicates an energy level difference between a LUMO level of the first electron-transport layer 16 and a LUMO level of the light-emitting layer 14 in each of the light-emitting elements. E3 indicates an energy level difference between a LUMO level of the light-emitting layer 14 and a LUMO level of the second hole-transport layer 12 in each of the light-emitting elements. E4 indicates an energy level difference between a LUMO level of the second hole-transport layer 12 and a LUMO level of the first hole-transport layer 10 in each of the light-emitting elements.

In particular, the energy level difference H2 in FIG. 5 indicates an energy level difference between a HOMO level of the second hole-transport layer 12G and a HOMO level of the first light-emitting layer 14GH in the light-emitting element 6G. Moreover, the energy level difference E2 in FIG. 5 indicates an energy level difference between a LUMO level of the first electron-transport layer 16 and a LUMO level of the second light-emitting layer 14GE in the light-emitting element 6G.

Furthermore, in FIG. 5, H5 is an energy level difference between a HOMO level of the first light-emitting layer 14GH and a HOMO level of the second light-emitting layer 14GE in the light-emitting element 6G. E5 indicates an energy level difference between a LUMO level of the second light-emitting layer 14GE and a LUMO level of the first light-emitting layer 14GH in the light-emitting element 6G.

As illustrated in FIG. 4, in the light-emitting element 6B, a value of the LUMO level of the first electron-transport layer 16 is as high as, or higher than, a value of the LUMO level of the second electron-transport layer 18. Moreover, in this embodiment, the first electron-transport layer 16 and the second electron-transport layer 18 are formed in common among the light-emitting elements 6R, 6G, and 6B. Hence, as illustrated in FIGS. 5 and 6, also in each of the light-emitting elements 6G and 6R, the value of the LUMO level of the first electron-transport layer 16 is as high as, or higher than, the value of the LUMO level of the second electron-transport layer 18.

Moreover, in the light-emitting element 6B illustrated in FIG. 4, the value of the LUMO level of the first electron-transport layer 16 is higher than a value of a LUMO level of the light-emitting layer 14B. Likewise, in the light-emitting element 6R illustrated in FIG. 6, the value of 5 the LUMO level of the first electron-transport layer 16 is as high as, or higher than, a value of the LUMO level of the light-emitting layer 14R. Moreover, in the light-emitting element 6G illustrated in FIG. 5, the value of the LUMO level of the first electron-transport layer 16 is higher than a value of the LUMO level of the second light-emitting layer 14GE included in the light-emitting layer 14G and having contact with the first electron-transport layer 16. In other words, in each of the light-emitting elements according to this embodiment, the value of the LUMO level of the first electron-transport layer 16 is higher than the value of the LUMO level of the light-emitting layer 14 in contact with the first electron-transport layer 16.

That is why the light-emitting device 2 according to this embodiment exhibits low efficiency in injection of the electrons from the second electron-transport layer 18 into the first electron-transport layer 16 when the light-emitting elements are driven. Such a feature decreases the concentration of the electrons in the first electron-transport layer 16, and, furthermore, the concentration of the electrons to be injected from the first electron-transport layer 16 into the light-emitting layer 14. Accordingly, the concentration of the electrons decreases in the light-emitting layer 14.

Typically, in designing a known multilayer field-effect light-emitting element, the efficiencies in injecting the holes from the hole-transport layer into the light-emitting layer and in injecting the electrons from the electron-transport layer into the light-emitting layer have to be increased to the maximum extent possible. Typically, however, the mobility of the holes is lower than the mobility of the electrons, and the efficiencies in injecting the holes from the anode to the hole-transport layer, and from the hole-transport layer to the light-emitting layer, are low.

Hence, when the known multilayer field-effect light-emitting element is driven, the concentration of the electrons increases in the light-emitting layer, and the electrons in the light-emitting layer are excessive. Hence, the carriers in the light-emitting layer are out of balance, thereby creating a period of emitting no light from the light-emitting layer and causing transportation of the electrons in the light-emitting layer further toward the anode. Such problems decrease the life of the light-emitting element.

When the light-emitting elements are driven, the light-emitting device 2 according to this embodiment can further decrease the concentration of the electrons in the light-emitting layer 14 than the known light-emitting element does. Hence, the light-emitting device 2 according to this embodiment reduces excessive electrons, and improves balance of the carriers, in the light-emitting layer 14. As a result, the light-emitting device 2 according to this embodiment reduces creation of a period of emitting no light from the light-emitting layer 14 and transportation of the electrons in the light-emitting layer 14 further toward the anode 8. Such features increase the lives of the light-emitting elements.

In particular, a difference between an energy level of the first electron-transport layer 16 at the LUMO level and an energy level of the second electron-transport layer 18 at the LUMO level is 0.35 eV or more. In other words, the energy level difference E1 is 0.35 eV or more. Hence, in each of the light-emitting elements according to this embodiment, a further decrease is observed of the efficiency in transportation of the electrons from the second electron-transport layer 18 to the first electron-transport layer 16.

Hence, thanks to the above features, when the light-emitting elements are driven, the light-emitting device 2 according to this embodiment can further decrease the concentration of the electrons in the light-emitting layer 14, making it possible to reduce more efficiently excessive electrons in the light-emitting layer 14 of each of the light-emitting elements.

Described next with reference to FIG. 4 is an energy level of each of the layers in the light-emitting element 6B according to this embodiment.

As illustrated in FIG. 4, a value of the HOMO level of the first electron-transport layer 16 is as low as, or lower than, a value of the HOMO level of the light-emitting layer 14B. Moreover, a difference between an energy level of the first electron-transport layer 16 at the HOMO level and an energy level of the light-emitting layer 14B at the HOMO level is 0.25 eV or more. In other words, the energy level difference H3 is 0.25 eV or more. More preferably, in this embodiment, the energy level difference H3 of the light-emitting element 6B is 0.45 eV or more.

Because of the above features, the hole injection efficiency decreases when the holes are injected from the light-emitting layer 14B into the first electron-transport layer 16. The decrease in hole injection efficiency makes it possible to keep the holes, transported to the light-emitting layer 14B, from further flowing toward the cathode 20. Accordingly, the concentration of the holes increases in the light-emitting layer 14B. Hence, thanks to the features, the balance of the carriers improves in the light-emitting layer 14B, and the life of the light-emitting element 6B further increases.

As illustrated in FIG. 4, a value of the LUMO level of the second hole-transport layer 12B is as high as, or higher than, the value of the LUMO level of the light-emitting layer 14B. Moreover, a difference between an energy level of the second hole-transport layer 12B at the LUMO level and an energy level of the light-emitting layer 14B at the LUMO level is 0.25 eV or more. In other words, the energy level difference E3 is 0.25 eV or more. More preferably, in this embodiment, the energy level difference E3 of the light-emitting element 6B is 0.45 eV or more.

Because of the above features, the electron injection efficiency decreases when the electrons are injected from the light-emitting layer 14B into the second hole-transport layer 12B. The decrease in the electron injection efficiency makes it possible to reduce injection of the electrons from the light-emitting layer 14B further toward the anode 8, and to keep the electrons and the holes from recombining together in a layer closer to the anode 8 than to the light-emitting layer 14B. Accordingly, the concentration of the holes increases in the light-emitting layer 14B. Hence, thanks to such features, the balance of the carriers improves in the light-emitting layer 14B, and the life of the light-emitting element 6B further increases.

As illustrated in FIG. 4, a value of the HOMO level of the second hole-transport layer 12B is between a value of the HOMO level of the first hole-transport layer 10 and a value of the HOMO level of the light-emitting layer 14B. In this embodiment, a difference between an energy level of the first hole-transport layer 10 at the HOMO level and an energy level of the light-emitting layer 14B at the HOMO level is 0.2 eV or less. In other words, the sum of the energy level differences H1 and H2 is 0.2 eV or less.

Alternatively, a difference between the energy level of the first hole-transport layer 10 at the HOMO level and an energy level of the second hole-transport layer 12B at the HOMO level and a difference between the energy level of the second hole-transport layer 12B at the HOMO level and the energy level of the light-emitting layer 14B at the HOMO level are both 0.1 eV or less. In other words, the energy level differences H1 and H2 are both 0.1 eV or less.

Thanks to the above features, the hole injection efficiency increases when the holes are injected from the first hole-transport layer 10 into the second hole-transport layer 12B, and from the hole-transport layer 12B into the light-emitting layer 14B. Accordingly, the concentration of the holes increases in the light-emitting layer 14B. Hence, thanks to the above features, the balance of the carriers improves in the light-emitting layer 14B, and the life of the light-emitting element 6B further increases.

Note that, in this embodiment, the value of the HOMO level of the light-emitting layer 14B is as low as, or lower than, the value of the HOMO level of the second hole-transport layer 12B, and the value of the HOMO level of the second hole-transport layer 12B is as low as, or lower than the value of the HOMO level of the first hole-transport layer 10.

In the light-emitting element 6B, the holes and the electrons recombine together in the light-emitting layer 14B. Hence, the light-emitting layer 14B generates light whose energy is equivalent to a difference between the value of the LUMO level of the light-emitting layer 14B and the value of the HOMO level of the light-emitting layer 14B. Preferably, the difference between the value of the LUMO level of the light-emitting layer 14B and the value of the HOMO level of the light-emitting layer 14B is 2.7 eV or more and 3.1 eV or less.

Described next more specifically with reference to FIG. 5 is an energy level of each of the layers in the light-emitting element 6G according to this embodiment.

As illustrated in FIG. 5, a value of the HOMO level of the second electron-transport layer 14GE is as low as, or lower than, a value of the HOMO level of the first light-emitting layer 14GH. Moreover, a difference between an energy level of the second light-emitting layer 14GE at the HOMO level and an energy level of the first light-emitting layer 14GH at the HOMO level is 0.25 eV or more. In other words, the energy level difference H5 is 0.25 eV or more. More preferably, in this embodiment, the energy level difference H5 of the light-emitting element 6G is 0.45 eV or more.

Because of the above features, the hole injection efficiency decreases when the holes are injected from the first light-emitting layer 14GH into the second light-emitting layer 14GE. The decrease in the hole injection efficiency makes it possible to keep the holes, transported to the light-emitting layer 14G, from further flowing toward the cathode 20. Accordingly, the concentration of the holes increases in the light-emitting layer 14G. Hence, thanks to the above features, the balance of the carriers improves in the light-emitting layer 14G, and the life of the light-emitting element 6G further increases.

As illustrated in FIG. 5, a value of the LUMO level of the first light-emitting layer 14GH is as high as, or higher than, the value of the LUMO level of the second light-emitting layer 14GE. Moreover, a difference between an energy level of the first light-emitting layer 14GH at the LUMO level and an energy level of the second light-emitting layer 14GE at the LUMO level is 0.25 eV or more. In other words, the energy level difference E3 is 0.25 eV or more. More preferably, in this embodiment, the energy level difference E3 of the light-emitting element 6G is 0.45 eV or more.

Because of the above features, the electron injection efficiency decreases when the electrons are injected from the second light-emitting layer 14GE into the first light-emitting layer 14GH. The decrease in the electron injection efficiency makes it possible to reduce injection of the electrons from the light-emitting layer 14G further toward the anode 8, and to keep the electrons and the holes from recombining together in a layer closer to the anode 8 than to the light-emitting layer 14G. As a result, the concentration of the holes increases in the light-emitting layer 14G. Hence, thanks to the above features, the balance of the carriers improve in the light-emitting layer 14G, and the life of the light-emitting element 6G further increases.

As illustrated in FIG. 5, a value of the HOMO level of the second hole-transport layer 12G is between the value of the HOMO level of the first hole-transport layer 10 and the value of the HOMO level of the first light-emitting layer 14GH. Moreover, in this embodiment, a difference between the energy level of the first hole-transport layer 10 at the HOMO level and the energy level of the first light-emitting layer 14GH at the HOMO level is 0.2 eV or less. In other words, the sum of the energy level differences H1 and H2 is 0.2 eV or less.

Alternatively, in this embodiment, a difference between the energy level of the first hole-transport layer 10 and an energy level of the second hole-transport layer 12G and a difference between the energy level of the second hole-transport layer 12G and the energy level of the light-emitting layer 14GH are both 0.1 eV or less. In other words, the energy level differences H1 and H2 are both 0.1 eV or less.

Thanks to the above features, the hole injection efficiency increases when the holes are injected from the first hole-transport layer 10 into the second hole-transport layer 12G, and from the hole-transport layer 12G into the first light-emitting layer 14GH. Accordingly, the concentration of the holes increases in the light-emitting layer 14G. Hence, thanks to such features, the balance of the carriers improves in the light-emitting layer 14G, and the life of the light-emitting element 6G further increases.

Note that, in this embodiment, the value of the HOMO level of the first light-emitting layer 14GH is as low as, or lower than, the value of the HOMO level of the second hole-transport layer 12G, and the value of the HOMO level of the second hole-transport layer 12G is as low as, or lower than, the value of the HOMO level of the first hole-transport layer 10.

In the light-emitting element 6G, the holes and the electrons recombine together on the interface between the first light-emitting layer 14GH and the second light-emitting layer 14GE. Hence, the light-emitting layer 14G generates light whose energy is equivalent to a difference between the value of the LUMO level of the second light-emitting layer 14GE and the value of the HOMO level of the first light-emitting layer 14GH. Preferably, the differences between the value of the LUMO level of the light-emitting layer 14B, the value of the LUMO level of the second light-emitting layer 14GE, and the value of the HOMO level of the first light-emitting layer 14GH are 2.4 eV or more and 2.7 eV or less.

Note that the light-emitting element 6R according to this embodiment may be the same in configuration as the light-emitting element 6B except that the light from the light-emitting layer 14R is red. For example, as illustrated in FIG. 6, a magnitude relationship among the values of the LUMO level and the HOMO level of each of the layers of the light-emitting element 6R may be the same as those of the light-emitting element 6B.

Specifically, the energy level difference H3 of the light-emitting element 6R is 0.25 eV or more, and more preferably, 0.45 eV or more. Moreover, the energy level difference E3 of the light-emitting element 6R is 0.25 eV or more, and more preferably, 0.45 eV or more.

Furthermore, a value of the HOMO level of the second hole-transport layer 12R is between the value of the HOMO level of the first hole-transport layer 10 and a value of the HOMO level of the light-emitting layer 14R. The sum of the energy level differences H1 and H2 of the light-emitting element 6R is 0.2 eV or less. Alternatively, the energy level differences H1 and H2 of the light-emitting element 6R are both 0.1 eV or less. Thanks to such features, the life of the light-emitting element 6R also increases further because of the same reasons described above.

Note that, in this embodiment, the value of the HOMO level of the light-emitting layer 14R is as low as, or lower than, the value of the HOMO level of the second hole-transport layer 12R, and the value of the HOMO level of the second hole-transport layer 12R is as low as, or lower than, the value of the HOMO level of the first hole-transport layer 10.

As described above, in this embodiment, each of the first hole-transport layer 10, the second hole-transport layer 12, the light-emitting layer 14, the first electron-transport layer 16, and the second electron-transport layer 18 is an organic layer containing an organic material. Accordingly, in this light-emitting device 2 according to this embodiment, the electron transport capability of the layers in each light-emitting element can be set lower than the electron transport capability observed when the layers in each light-emitting element are inorganic layers containing an inorganic material having high electron transport capability. Hence, the light-emitting device 2 according to this embodiment reduces excessive electrons, and improves balance of the carriers, in the light-emitting layer 14.

Note that, in this embodiment, the light-emitting layer 14G is formed in, but not limited to, a double-layer structure including the first light-emitting layer 14GH and the second light-emitting layer 14GE. For example, the light-emitting layer 14G may be a single light-emitting layer formed by co-evaporation of three materials such as a hole-transporting material, an electron-transporting material, and a dopant.

Described below are examples of the light-emitting device 2 according to this embodiment, compared with comparative examples of light-emitting devices according to comparative embodiments below. Described first are the light-emitting devices according to the comparative embodiments, with reference to FIGS. 7 to 9.

The light-emitting devices according to the comparative embodiments are different from the light-emitting device 2 according to this embodiment only in the material of the first hole-transport layer 10 and in the energy band of each of the layers of the light-emitting-element layer 6. That is, the light-emitting devices according to the comparative embodiments are the same in configuration as the light-emitting device 2 according to this embodiment.

In each of the light-emitting devices according to the comparative embodiments, the first hole-transport layer 10 is made only of the hole-transport material 26. In other words, the first hole-transport layer 10 according to the comparative embodiments does not contain the polysiloxane-based polymer 24.

Hence, the first hole-transport layer 10 according to the comparative embodiments is lower in heat resistance than the first hole-transport layer 10 according to this embodiment. Thus, the light-emitting elements 6R, 6G, and 6B according to the comparative embodiments are low in resistance to a temperature rise that occurs when the light-emitting elements are driven. Specifically, the first hole-transport layer 10 is likely to deteriorate by the temperature rise that occurs when the light-emitting elements according to the comparative embodiments are driven. Accordingly, in the light-emitting elements, the transport efficiency decreases when the holes are transported from the anode 8 to the light-emitting layer 14.

Figure 7:
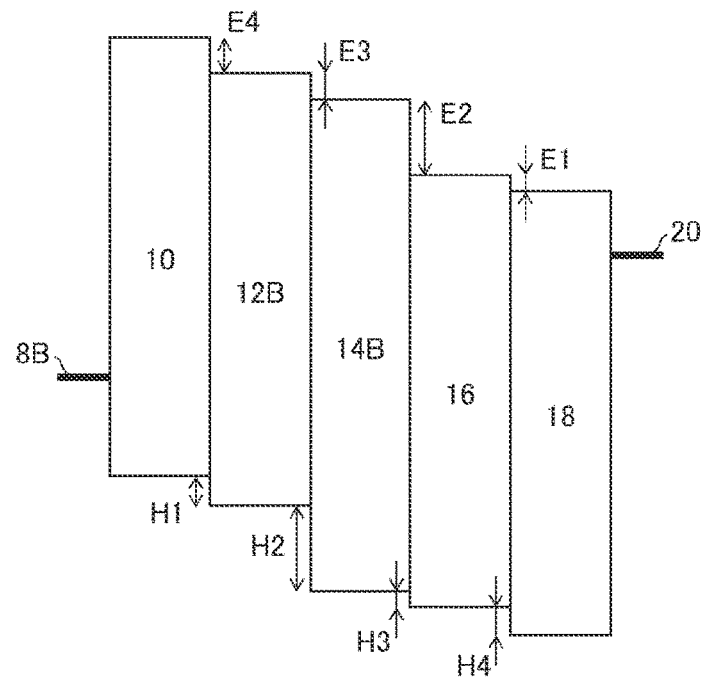
FIG. 7 illustrates an energy diagram showing an example of either a Fermi level of, or a LUMO level and a HOMO level of, each layer in a light-emitting element of a light-emitting device according to a comparative embodiment.
Figure 8:
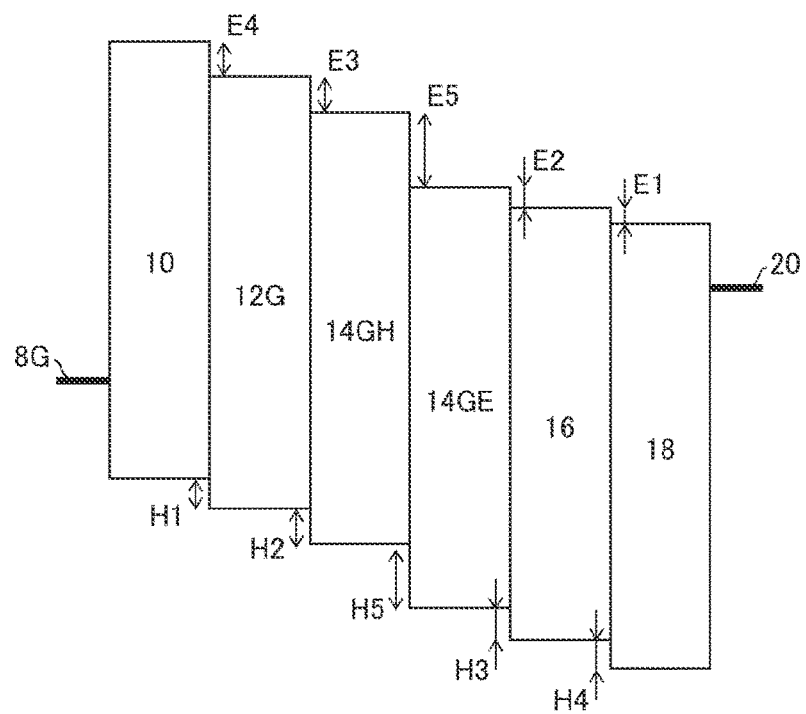
FIG. 8 illustrates an energy diagram showing an example of either a Fermi level of, or a LUMO level and a HOMO level of, each layer in another light-emitting element of the light-emitting device according to the comparative embodiment.
Figure 9:
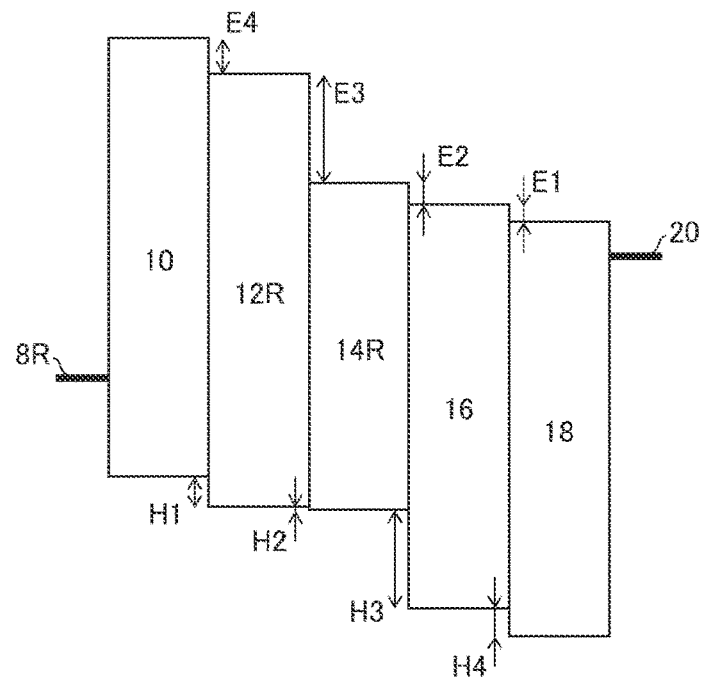
FIG. 9 illustrates an energy diagram showing an example of either a Fermi level of, or a LUMO level and a HOMO level of, each layer in another light-emitting element of the light-emitting device according to the comparative embodiment.

Described next is an energy band of each of the layers of the light-emitting elements included in the light-emitting-element layer 6 of the light-emitting devices according to the comparative embodiments. FIG. 7 illustrates an energy band diagram showing an example of either a Fermi level of, or a bandgap of, each layer in the light-emitting element 6B of a light-emitting device according to a comparative embodiment. FIG. 8 illustrates an energy band diagram showing an example of either a Fermi level of, or a bandgap of, each layer in the light-emitting element 6G of a light-emitting device according to a comparative embodiment. FIG. 9 illustrates an energy band diagram showing an example of either a Fermi level of, or a bandgap of, each layer in the light-emitting element 6R of a light-emitting device according to a comparative embodiment.

Each of FIGS. 7 to 9 shows that, a difference between an energy level of the first electron-transport layer 16 at the LUMO level and an energy level of the second electron-transport layer 18 at the LUMO level in the comparative embodiments is smaller than the difference between the energy level of the first electron-transport layer 16 at the LUMO level and an energy level of the second electron-transport layer 18 at the LUMO level in this embodiment. In other words, the energy level difference E1 in the comparative embodiments is smaller than the energy level difference E1 in this embodiment.

In particular, the difference between the energy level of the first electron-transport layer 16 at the LUMO level and the energy level of the second electron-transport layer 18 at the LUMO level is less than 0.35 eV. In other words, the energy level difference E1 is less than 0.35 eV.

That is why, when the light-emitting elements are driven, the efficiency in injection of the electrons from the second electron-transport layer 18 into the first electron-transport layer 16 is higher in the light-emitting devices according to the comparative embodiments than in the light-emitting device 2 according to this embodiment. Hence, in the comparative embodiments, the concentration of the electrons increases in the first electron-transport layer 16, and, furthermore, the concentration of the electrons to be injected from the first electron-transport layer 16 into the light-emitting layer 14 also increases. Accordingly, the concentration of the electrons increases in the light-emitting layer 14.

As can be seen, when the light-emitting elements are driven in the light-emitting devices according to the comparative embodiments, the concentration of the electrons increases in the light-emitting layer 14. As a result, the electrons are excessive in the light-emitting layer 14. Hence, compared with the light-emitting device 2 according to this embodiment, in the light-emitting devices according to the comparative embodiments, the carriers in the light-emitting layer 14 are out of balance. As a result, the lives of the light-emitting elements decrease.

In order to compare the light-emitting elements of the light-emitting device 2 according to this embodiment with those of the light-emitting devices according to the comparative embodiments, light-emitting elements according to Examples 1 to 34 and Comparative Examples 1 to 8 were prepared, and properties of the light-emitting elements were measured.

Examples 1 to 25

The light-emitting device according to each of Examples 1 to 15 is the same in configuration as the light-emitting element 6B of the light-emitting device 2 according to this embodiment. The light-emitting device according to each of Examples 16 to 20 is the same in configuration as the light-emitting element 6G of the light-emitting device 2 according to this embodiment. The light-emitting device according to each of Examples 21 to 25 is the same in configuration as the light-emitting element 6R of the light-emitting device 2 according to this embodiment.

In producing the light-emitting element according to each of Examples 1 to 25, first, ITO was formed as the anode 8.

Next, on the anode 8, the polysiloxane-based polymer 24 and the hole-transport material 26 were co-evaporated to form the first hole-transport layer 10.

Here, in Examples 1 to 5 and 11 to 25, the polymer expressed by the above formula (3) was adopted as the polysiloxane-based polymer 24. The adopted polymer had a weight-average molecular weight of approximately 30,000. Moreover, in Examples 6 to 10, the polymer expressed by the above formula (4) was adopted as the polysiloxane-based polymer 24. The adopted polymer had a weight-average molecular weight of approximately 25,000.

Furthermore, in Examples 1 to 10 and 16 to 25, the NPD expressed by the above formula (5) was adopted as the hole-transport material 26. In Examples 11 to 15, the BMMD expressed by the above formula (6) was adopted as the hole-transport material 26.

In addition, the weight ratio of the polysiloxane-based polymer 24 to the hole-transport material 26 was changed for each of Examples. In Examples 1, 6, 11, 16, and 21, the weight ratio was set to 1 to 1,000. In Examples 2, 7, 12, 17, and 22, the weight ratio was set to 1 to 100. In Examples 3, 8, 13, 18, and 23, the weight ratio was set to 1 to 10. In Examples 4, 9, 14, 19, and 24, the weight ratio was set to 1 to 2. In Examples 5, 10, 15, 20, and 25, the weight ratio was set to 1 to 1.

Next, on the first hole-transport layer 10, the second hole-transport layer 12, the light-emitting layer 14, the first electron-transport layer 16, and the second electron-transport layer 18 were formed of respective materials by vapor deposition. Moreover, in Examples, lithium fluoride was vapor-deposited on the second electron-transport layer 18 as an electron-injection layer. Then, on the electron-injection layer, a Mg—Ag alloy was vapor-deposited to form the cathode 20.

Here, in Examples 1 to 15, an organic light-emitting material emitting blue light was co-evaporated with a host material to form the light-emitting layer 14. Moreover, in Examples 16 to 20, an organic light-emitting material emitting green light was co-evaporated with a host material to form the light-emitting layer 14. Furthermore, in Examples 21 to 25, an organic light-emitting material emitting red light was co-evaporated with a host material to form the light-emitting layer 14.

In Examples, on the cathode 20, a capping layer was formed by vapor deposition. The capping layer was made of a compound containing an aromatic amine group. An example of a material contained in the capping layer includes a compound containing an aromatic amine group. After that, the light-emitting element was sealed with a seal material containing an inorganic-organic composite material. Hence, the light-emitting elements according to Examples were obtained.

Comparative Examples 1 to 5

The light-emitting devices according to Comparative Examples 1 to 3 are the same in configuration as the light-emitting element 6B of the light-emitting devices according to the comparative embodiments. The light-emitting device according to Comparative Example 4 is the same in configuration as the light-emitting elements 6G of the light-emitting devices according to the comparative embodiments. The light-emitting device according to Comparative Example 5 is the same in configuration as the light-emitting elements 6R of the light-emitting devices according to the comparative embodiments.

The light-emitting element according to each of Comparative Examples 1 to 3 was obtained by the same technique by which the light-emitting element according to each of Examples 1 to 15 was obtained, except for the step of forming the first hole-transport layer 10. Likewise, the light-emitting element according to Comparative Example 4 was obtained by the same technique by which the light-emitting element according to each of Examples 16 to 20 was obtained, except for the step of forming the first hole-transport layer 10. Likewise, the light-emitting element according to Comparative Example 5 was obtained by the same technique by which the light-emitting element according to each of Examples 21 to 25 was obtained, except for the step of forming the first hole-transport layer 10.

In Comparative Examples 1 to 5, the hole-transport material 26 alone was vapor-deposited on the anode 8 to form the first hole-transport layer 10. Hence, in Comparative Examples 1 to 5, the weight ratio of the polysiloxane-based polymer 24 to the hole-transport material 26 was zero. Note that, in Comparative Examples 1, 2, 4, and 5, the hole-transport material 26 was made of the NPD. In Comparative Example 3, the hole-transport material 26 was made of the BMMD. Hence, practically, the light-emitting element according to Comparative Example 1 and the light-emitting element according to Comparative Example 2 are the same light-emitting elements.

Examples 26 to 30

The light-emitting device according to each of Examples 26 to 30 is the same in configuration as the light-emitting element 6B of the light-emitting device 2 according to this embodiment. The light-emitting element according to each of Examples 26 to 30 was obtained by the same technique by which the light-emitting element according to each of Examples 1 to 5 was obtained, except for the weight-average molecules weight of the polysiloxane-based polymer 24 in the step of forming the first hole-transport layer 10.

Here, the weight-average molecular weight of the polysiloxane-based polymer 24 was changed for each of Examples 26 to 30. In Example 26, the weight-average molecular weight of the polysiloxane-based polymer 24 was approximately 5,000. In Example 27, the weight-average molecular weight of the polysiloxane-based polymer 24 was approximately 15,000. In Example 28, the weight-average molecular weight of the polysiloxane-based polymer 24 was approximately 30,000. In Example 29, the weight-average molecular weight of the polysiloxane-based polymer 24 was approximately 50,000. In Example 30, the weight-average molecular weight of the polysiloxane-based polymer 24 was approximately 65,000. Hence, practically, the light-emitting element according to Example 3 and the light-emitting element according to Example 28 are the same light-emitting elements.

Result of Measuring Properties of Light-Emitting Elements

Next, properties of the light-emitting elements according to Examples 1 to 30 and Comparative Examples 1 to 5 were measured. Specifically, at an environment temperature of 25° C. or of 90° F., a voltage was applied across an electrode of each of the light-emitting elements, and the life of each electrode was measured. Here, the voltage generated a current having a current density of 50 mA/cm$^2$. Moreover, each of the light-emitting elements was left at an environment temperature of 120° C. for 1,000 hours. Before and after each light-emitting element was left, the external quantum efficiency of the light-emitting element was measured.

Note that, in Description, the "life" of the light-emitting element is a time period in which the luminance of the light-emitting element falls to 90% of the initial luminance that the light-emitting element exhibits immediately after the light-emitting element is produced.

Tables 1 to 6 below show the properties of the light-emitting elements according to Examples 1 to 30 and Comparative Examples 1 to 5.

TABLE 1

|  |  | EXAMPLE 1 | EXAMPLE 2 | EXAMPLE 3 | EXAMPLE 4 | EXAMPLE 5 | COMPARATIVE EXAMPLE 1 |
|---|---|---|---|---|---|---|---|
| WEIGHT RATIO | | 1:1,000 | 1:100 | 1:10 | 1:2 | 1:1 | 0 |
| LIFE AT ROOM TEMPERATURE (h) | | 230 | 370 | 380 | 385 | 385 | 120 |
| LIFE AT HIGH TEMPERATURE (h) | | 40 | 88 | 90 | 91 | 97 | 21 |
| EQE(%) | BEFORE LEFT | 12.9 | 12.8 | 12.8 | 12.6 | 10.0 | 12.9 |
|  | AFTER LEFT | 12.2 | 12.9 | 12.8 | 12.6 | 10.2 | 10.5 |

TABLE 2

|  |  | EXAMPLE 6 | EXAMPLE 7 | EXAMPLE 8 | EXAMPLE 9 | EXAMPLE 10 | COMPARATIVE EXAMPLE 2 |
|---|---|---|---|---|---|---|---|
| WEIGHT RATIO | | 1:1,000 | 1:100 | 1:10 | 1:2 | 1:1 | 0 |
| LIFE AT ROOM TEMPERATURE (h) | | 280 | 390 | 400 | 430 | 430 | 120 |
| LIFE AT HIGH TEMPERATURE (h) | | 58 | 94 | 97 | 101 | 100 | 21 |
| EQE(%) | BEFORE LEFT | 13.4 | 13.4 | 13.5 | 13.0 | 11.5 | 12.9 |
|  | AFTER LEFT | 13.2 | 13.4 | 13.5 | 13.3 | 11.1 | 10.5 |

TABLE 3

|  |  | EXAMPLE 11 | EXAMPLE 12 | EXAMPLE 13 | EXAMPLE 14 | EXAMPLE 15 | COMPARATIVE EXAMPLE 3 |
|---|---|---|---|---|---|---|---|
| WEIGHT RATIO | | 1:1,000 | 1:100 | 1:10 | 1:2 | 1:1 | 0 |
| LIFE AT ROOM TEMPERATURE (h) | | 190 | 300 | 320 | 365 | 365 | 110 |
| LIFE AT HIGH TEMPERATURE (h) | | 33 | 60 | 71 | 80 | 83 | 18 |
| EQE(%) | BEFORE LEFT | 12.4 | 12.5 | 12.4 | 12.3 | 11.0 | 12.4 |
|  | AFTER LEFT | 10.1 | 12.0 | 12.7 | 12.4 | 12.4 | 10.3 |

TABLE 4

|  | EXAMPLE 16 | EXAMPLE 17 | EXAMPLE 18 | EXAMPLE 19 | EXAMPLE 20 | COMPARATIVE EXAMPLE 4 |
|---|---|---|---|---|---|---|
| WEIGHT RATIO | 1:1,000 | 1:100 | 1:10 | 1:2 | 1:1 | 0 |
| LIFE AT ROOM TEMPERATURE (h) | 490 | 510 | 520 | 525 | 505 | 370 |
| LIFE AT HIGH TEMPERATURE (h) | 117 | 130 | 135 | 135 | 131 | 75 |
| EQE(%) BEFORE LEFT | 33.1 | 33.1 | 33.2 | 32.4 | 29.8 | 32.5 |
| AFTER LEFT | 33.3 | 33.3 | 33.2 | 32.4 | 30.3 | 26.4 |

TABLE 5

|  |  | EXAMPLE 21 | EXAMPLE 22 | EXAMPLE 23 | EXAMPLE 24 | EXAMPLE 25 | COMPARATIVE EXAMPLE 5 |
|---|---|---|---|---|---|---|---|
| WEIGHT RATIO | | 1:1,000 | 1:100 | 1:10 | 1:2 | 1:1 | 0 |
| LIFE AT ROOM TEMPERATURE (h) | | 580 | 580 | 585 | 580 | 570 | 480 |
| LIFE AT HIGH TEMPERATURE (h) | | 145 | 152 | 152 | 150 | 146 | 113 |
| EQE(%) | BEFORE LEFT | 34.1 | 34.3 | 34.3 | 33.8 | 33.1 | 34.2 |
|  | AFTER LEFT | 33.5 | 33.6 | 34.5 | 33.8 | 32.7 | 30.2 |

TABLE 6

|  | EXAMPLE 26 | EXAMPLE 27 | EXAMPLE 28 | EXAMPLE 29 | EXAMPLE 30 | COMPARATIVE EXAMPLE 1 |
|---|---|---|---|---|---|---|
| WEIGHT-AVERAGE MOLECULAR WEIGHT | 5,000 | 15,000 | 30,000 | 50,000 | 65,000 | |
| LIFE AT ROOM TEMPERATURE (h) | 320 | 360 | 360 | 360 | 305 | 120 |
| LIFE AT HIGH TEMPERATURE (h) | 88 | 91 | 90 | 87 | 60 | 21 |
| EQE(%) BEFORE LEFT | 13.1 | 12.6 | 12.8 | 12.7 | 11.4 | 12.9 |
| AFTER LEFT | 13 | 12.8 | 12.8 | 12.4 | 10.5 | 10.5 |

Here, in Tables 1 to 6, the columns "Example 1" to "Example 30" and "Comparative Example 1" to "Comparative Example 5" show properties of the light-emitting elements according to the respective Examples or Comparative Examples.

Moreover, in Tables 1 to 5, the boxes "WEIGHT RATIO" each show a weight ratio of the polysiloxane-based polymer 24 to the hole-transport material 26 of each of the first hole-transport layers 10 in the respective light-emitting elements. Moreover, in Table 6, the boxes "WEIGHT-AVERAGE MOLECULAR WEIGHT" each show a weight-average molecular weight of the polysiloxane-based polymer 24 contained in each of the first hole-transport layers 10 in the respective light-emitting elements.

Furthermore, in Tables 1 to 6, the boxes "LIFE AT ROOM TEMPERATURE" each show a life of each of the light-emitting elements when the above voltage was applied at an environment temperature of 25° C. The lives are represented in hours (h). The boxes "LIFE AT HIGH TEMPERATURE" each show a life of each of the light-emitting elements when the above voltage was applied at an environment temperature of 90° C. The lives are represented in hours (h). The boxes "EQE" each show a percentage of the external quantum efficiency for each of the light-emitting elements when the above voltage was applied. Of the boxes "EQE", the boxes "BEFORE LEFT" show a percentage of the external quantum efficiency for each of the light-emitting elements immediately after the light-emitting element was produced. The boxes "AFTER LEFT" show a percentage of the external quantum efficiency for each of the light-emitting elements after the light-emitting element was left for 1,000 hours at an environment temperature of 120° C.

As can be clearly seen from Tables 1 to 5, in comparison among the light-emitting elements emitting light in the same color, the lives at normal temperature and the lives at high temperature of the light-emitting elements according to Examples are respectively longer than the lives at normal temperature and the lives at high temperature of the light-emitting elements according to Comparative Examples. This can be surmised that, because the first hole-transport layer 10 of the light-emitting element according to each of Examples contained the polysiloxane-based polymer 24 resistant to heat, the light-emitting element according to each Example exhibited an increase in thermal resistance to a temperature rise that occurred when the light-emitting element was driven. In particular, the light-emitting elements according to Examples show a significant improvement in life at high temperature with respect to the light-emitting elements according to Comparative Examples.

Moreover, in the light-emitting elements according to Examples, the life at normal temperature and the life at high temperature tend to extend more with an increasing weight ratio of the polysiloxane-based polymer 24 to the hole-transport material 26. This can be surmised that, for the first hole-transport layer 10 of the light-emitting element according to each of Examples, thermal resistance of the light-emitting element increases more with an increasing content of the polysiloxane-based polymer 24 resistant to heat.

Furthermore, as can be clearly seen from Tables 1 to 5, the light-emitting elements according to Examples exhibited smaller variations in external quantum efficiency before and after the light-emitting elements were left under a high-temperature environment than the variations in external quantum efficiency exhibited by the light-emitting elements according to Comparative Examples before and after the light-emitting elements were left under a high-temperature environment. This can also be surmised that the light-emitting element according to each Example exhibited an increase in thermal resistance to a temperature rise that occurred when the light-emitting element was driven.

Note that, in the light-emitting elements according to Examples, the external quantum efficiency of the light-emitting elements tends to increase more with a decreasing weight ratio of the polysiloxane-based polymer 24 to the hole-transport material 26. This can be surmised that, in the first hole-transport layer 10 of the light-emitting element according to each of Examples, the hole transportation capability of the hole-transport layer 10 increases more with an increasing content of the hole transport material 26 having a high hole transportation capability.

As can be clearly seen from Table 6, the lives at normal temperature and the lives at high temperature of the light-emitting elements according to Examples 26 to 30 are respectively longer than the life at normal temperature and the life at high temperature of the light-emitting elements according to Comparative Example 1 with the same configuration as the configurations in Examples 26 to 30. Furthermore, the light-emitting elements according to Examples 26 to 30 exhibited smaller variations in external quantum efficiency before and after the light-emitting elements were left under a high-temperature environment than the variations in external quantum efficiency exhibited by the light-emitting elements according to Comparative Examples 1 to 5 before and after the light-emitting elements were left under a high-temperature environment.

Note that, in the light-emitting element according to each of Examples 26 to 30, the external quantum efficiency of the light-emitting element tends to increase more with a decreasing weight-average molecular weight of the polysiloxane-based polymer 24. This can be surmised that, with a decreasing weight-average molecular weight of the polysiloxane-based polymer 24, the polysiloxane-based polymer 24 increases more in the molecular flexibility, and eventually increases more in hole transportation capability.

Moreover, in the light-emitting element according to each of Examples 26 to 30, the life at normal temperature and the life at high temperature of the light-emitting element tend to extend more with a decreasing weight-average molecular weight of the polysiloxane-based polymer 24. Here, with a decreasing weight-average molecular weight of the polysiloxane-based polymer 24, the polysiloxane-based polymer 24 increases more in molecular flexibility, and eventually increases more in affinity for the hole transport material 26. This can be surmised that, with a decreasing weight-average molecular weight of the polysiloxane-based polymer 24, the first hole-transport layer 10 increases more in homogeneity, and eventually, the lives of the light-emitting elements extend more.

However, as can be clearly seen from Table 6, the life at normal temperature and life at high temperature of the light-emitting element decrease when the weight-average molecular weight of the polysiloxane-based polymer 24 decreases to approximately 5,000. This can be surmised that, the polysiloxane-based polymer 24 needs to be molecularly rigid, and eventually needs to be large in weight-average molecular weight to some extent, in order to be resistant to heat.

Example 31

The light-emitting device according to this Example is the same in configuration as the light-emitting element 6B of the light-emitting device 2 according to this embodiment.

In producing the light-emitting element according to this Example, first, ITO was formed as the anode 8.

Next, on the anode 8, the polysiloxane-based polymer 24 and the hole-transport material 26 were co-evaporated to form the first hole-transport layer 10 (HOMO: −5.55 eV, and LUMO: −2.45 eV).

Here, in Example 31, the polymer expressed by the above formula (3) was adopted as the polysiloxane-based polymer 24. The adopted polymer had a weight-average molecular weight of approximately 30,000. Furthermore, in Example 31, the NPD expressed by the above formula (5) was adopted as the hole-transport material 26.

Next, on the first hole-transport layer 10, an electron-blocking material having a carbazole-based skeleton was vapor-deposited to form the second hole-transport layer 12B (HOMO: −5.65 eV, and LUMO: −2.46 eV).

After that, on the second hole-transport layer 12B, the light-emitting layer 14B was formed. The light-emitting layer 14B was formed by co-evaporation of a host material and a fluorescence emission dopant. The host material to be adopted was an anthracene-adamantane-based compound (HOMO: −5.74 eV, and LUMO: −2.80 eV). Moreover, the fluorescence emission dopant to be adopted was an anthracene-naphthalene-based compound (HOMO: −5.85 eV, and LUMO: −2.90 eV)

Next, on the light-emitting layer 14B, a hole-blocking material containing a triazole-based compound was vapor-deposited to form the first electron-transport layer 16 (HOMO: −6.01 eV, and LUMO: −2.57 eV).

After that, on the first electron-transport layer 16, an electron-transport material containing an oxadiazole-based compound was vapor-deposited to form the second electron-transport layer 18 (HOMO: −6.41 eV, and LUMO: −2.98 eV).

Moreover, in this Example, a capping layer was formed further on the cathode 20 by vapor deposition. The capping layer was made of a compound containing an aromatic amine group. After that, the light-emitting element was sealed with a seal material containing an inorganic-organic composite material. Furthermore, lithium fluoride was vapor-deposited on the second electron-transport layer 18 as an electron-injection layer. Then, on the electron-injection layer, a Mg—Ag alloy was vapor-deposited to form the cathode 20.

In this Example, the obtained light-emitting element emitted light whose chromaticity was represented by CIE coordinates of (x, y)=(0.140, 0.045). Note that, in this Example, the difference between the value of the LUMO level of the light-emitting layer 14B and the value of the HOMO level of the light-emitting layer 14B was 2.94 eV.

Example 32

The light-emitting device according to this Example is the same in configuration as the light-emitting element 6B of the light-emitting device 2 according to this embodiment.

The light-emitting element according to this Example was obtained by the same technique by which the light-emitting element according to Example 31 was obtained, except that, in the step of forming the light-emitting layer 14B, a different host material (HOMO: −5.73 eV, and LUMO: −2.81 eV) was adopted.

Note that, in this Example, ytterbium (Yb) was vapor-deposited further on the second electron-transport layer 18 as an electron-injection layer.

Above the electron-injection layer, the cathode 20 and the capping layer were formed by the same techniques as those of above Examples, and the light-emitting element was sealed with the seal material by the same technique as that of above Examples.

In this Example, the obtained light-emitting element emitted light whose chromaticity was represented by CIE coordinates of (x, y)=(0.145, 0.046). Note that, in this Example, the difference between the value of the LUMO level of the light-emitting layer 14B and the value of the HOMO level of the light-emitting layer 14B was 2.92 eV.

Example 33

The light-emitting device according to this Example is the same in configuration as the light-emitting element 6G of the light-emitting device 2 according to this embodiment.

In producing the light-emitting element according to this Example, first, ITO was formed as the anode 8.

Next, on the anode 8, the polysiloxane-based polymer 24 and the hole-transport material 26 were co-evaporated to form the first hole-transport layer 10 (HOMO: −5.55 eV, and LUMO: −2.45 eV).

Here, in Example 31, the polymer expressed by the above formula (3) was adopted as the polysiloxane-based polymer 24. The adopted polymer had a weight-average molecular weight of approximately 30,000. Furthermore, in Example 31, the NPD expressed by the above formula (5) was adopted as the hole-transport material 26.

Next, on the first hole-transport layer 10, an electron-blocking material containing a carbazole-based compound was vapor-deposited to form the second hole-transport layer 12G (HOMO: −5.62 eV, and LUMO: −2.46 eV).

After that, on the second hole-transport layer 12G, the first light-emitting layer 14GH and the second light-emitting layer 14GE were formed in the stated order to form the light-emitting layer 14G. The light-emitting layer 14G was formed by co-evaporation of three materials such as a hole-transporting material, an electron-transporting material, and a fluorescence emission dopant. The hole-transporting material to be adopted was a rubrene-based compound (HOMO: −5.64 eV, and LUMO: −2.40 eV). The electron-transporting material to be adopted was an aluminum-quinolinolate-complex-based material (HOMO: −5.98 eV, and LUMO: −2.90 eV). The fluorescence emission dopant to be adopted was an iridium complex (HOMO: −5.60 eV, and LUMO: −2.90 eV).

Next, on the light-emitting layer 14G, a hole-blocking material containing a triazole-based compound was vapor-deposited to form the first electron-transport layer 16 (HOMO: −6.01 eV, and LUMO: −2.57 eV).

After that, on the first electron-transport layer 16, an electron-transport material containing an oxadiazole-based compound was vapor-deposited to form the second electron-transport layer 18 (HOMO: −6.41 eV, and LUMO: −2.98 eV).

Moreover, in this Example, lithium fluoride was vapor-deposited on the second electron-transport layer 18 as an electron-injection layer.

Above the electron-injection layer, the cathode 20 and the capping layer were formed by the same techniques as those of above Examples, and the light-emitting element was sealed with the seal material by the same technique as that of above Examples.

In this Example, the obtained light-emitting element emitted light whose chromaticity was represented by CIE coordinates of (x, y)=(0.220, 0.733). Note that, in this Example, the difference between the value of the LUMO level of the second light-emitting layer 14GE and the value of the HOMO level of the first light-emitting layer 14GH was 2.72 eV.

Example 34

The light-emitting device according to this Example is the same in configuration as the light-emitting element 6G of the light-emitting device 2 according to this embodiment.

In producing the light-emitting element according to this Example, first, ITO was formed as the anode 8.

Next, on the anode 8, the polysiloxane-based polymer 24 and the hole-transport material 26 were co-evaporated to form the first hole-transport layer 10.

Here, in Example 31, the polymer expressed by the above formula (3) was adopted as the polysiloxane-based polymer 24. The adopted polymer had a weight-average molecular weight of approximately 30,000. Furthermore, in Example 31, the NPD expressed by the above formula (5) was adopted as the hole-transport material 26.

Next, on the first hole-transport layer 10, an electron-blocking material containing a carbazole-based compound was vapor-deposited to form the second hole-transport layer 12R (HOMO: −5.70 eV, and LUMO: −2.46 eV).

After that, on the second hole-transport layer 12R, the light-emitting layer 14R was formed. The light-emitting layer 14R was formed by co-evaporation of a host material and a fluorescence emission dopant. The host material to be adopted was an aluminum-quinolinolate-complex-based material (HOMO: −5.70 eV, and LUMO: −2.58 eV). The fluorescence emission dopant to be adopted was an iridium complex (HOMO: −5.50 eV, and LUMO: −2.98 eV).

Next, on the light-emitting layer 14R, a hole-blocking material containing a triazole-based compound was vapor-deposited to form the first electron-transport layer 16 (HOMO: −6.01 eV, and LUMO: −2.57 eV).

After that, on the first electron-transport layer 16, an electron-transport material containing an oxadiazole-based compound was vapor-deposited to form the second electron-transport layer 18 (HOMO: −6.41 eV, and LUMO: −2.98 eV).

Moreover, in this Example, lithium fluoride was vapor-deposited on the second electron-transport layer 18 as an electron-injection layer.

Above the electron-injection layer, the cathode 20 and the capping layer were formed by the same techniques as those of above Examples, and the light-emitting element was sealed with the seal material by the same technique as that of above Examples.

In this Example, the obtained light-emitting element emitted light whose chromaticity was represented by CIE coordinates of (x, y)=(0.695, 0.305). Note that, in this Example, the difference between the value of the LUMO level of the light-emitting layer 14R and the value of the HOMO level of the light-emitting layer 14R was 2.52 eV.

Comparative Example 6

The light-emitting device according to Comparative Example 6 is the same in configuration as the light-emitting elements 6B of the light-emitting devices according to the comparative embodiments. Moreover, the light-emitting element according to this Comparative Example is the same in configuration as the light-emitting element according to Example 31 except that the first hole-transport layers 10 are made of different materials, and the first electron-transport layer 16 are made of different materials, between this Example and Example 31. Hence, the light-emitting element according to this Comparative Example is formed by the same technique by which the light-emitting element according to Example 31 is formed except for the techniques of forming the first hole-transport layers 10 and the first electron-transport layers 16.

In particular, in a step of forming the light-emitting element according to this Comparative Example, the hole-transport material 26 (HOMO: −5.55 eV, and LUMO: −2.45 eV) alone was vapor-deposited to form the first hole-transport layer 10. Moreover, in a step of forming the light-emitting element according to this Comparative Example, a hole-blocking material containing a triazole-based compound was vapor-deposited on the light-emitting layer 14B to form the first electron-transport layer 16 (HOMO: −6.11 eV, and LUMO: −2.89 eV).

In this Comparative Example, the obtained light-emitting element emitted light whose chromaticity was represented by CIE coordinates of (x, y)=(0.137, 0.051). Note that, in this Comparative Example, the difference between the value of the LUMO level of the light-emitting layer 14B and the value of the HOMO level of the light-emitting layer 14B was 2.94 eV.

Comparative Example 7

The light-emitting device according to this Comparative Example is the same in configuration as the light-emitting elements 6G of the light-emitting devices according to the comparative embodiments. Moreover, the light-emitting element according to this Comparative Example is the same in configuration as the light-emitting element according to Example 33 except that the first hole-transport layers 10 are made of different materials, and the first electron-transport layer 16 are made of different materials, between this Example and Example 33. Hence, the light-emitting element according to this Comparative Example is formed by the same technique by which the light-emitting element according to Example 33 is formed except for the techniques of forming the first hole-transport layers 10 and the first electron-transport layers 16.

In particular, in a step of forming the light-emitting element according to this Comparative Example, the hole-transport material 26 (HOMO: −5.55 eV, and LUMO: −2.45 eV) alone was vapor-deposited to form the first hole-transport layer 10. Moreover, in a step of forming the light-emitting element according to this Comparative Example, a hole-blocking material containing a triazole-based compound was vapor-deposited on the light-emitting layer 14G to form the first electron-transport layer 16 (HOMO: −6.11 eV, and LUMO: −2.89 eV).

In this Comparative Example, the obtained light-emitting element emitted light whose chromaticity was represented by CIE coordinates of (x, y)=(0.232, 0.725). Not that, in this Comparative Example, the difference between the value of the LUMO level of the second light-emitting layer 14GE and the value of the HOMO level of the first light-emitting layer 14GH was 2.72 eV.

Comparative Example 8

The light-emitting device according to this Comparative Example is the same in configuration as the light-emitting elements 6R of the light-emitting devices according to the comparative embodiments. Moreover, the light-emitting element according to this Comparative Example is the same in configuration as the light-emitting element according to Example 34 except that the first hole-transport layers 10 are made of different materials, and the first electron-transport layer 16 are made of different materials, between this Example and Example 34. Hence, the light-emitting element according to this Comparative Example is formed by the same technique by which the light-emitting element according to Example 34 is formed except for the techniques of forming the first hole-transport layers 10 and the first electron-transport layers 16.

In particular, in a step of forming the light-emitting element according to this Comparative Example, the hole-transport material 26 (HOMO: −5.55 eV, and LUMO: −2.45 eV) alone was vapor-deposited to form the first hole-transport layer 10. Moreover, in a step of forming the light-emitting element according to this Comparative Example, a hole-blocking material containing a triazole-based compound was vapor-deposited on the light-emitting layer 14R to form the first electron-transport layer 16 (HOMO: −6.11 eV, and LUMO: −2.89 eV).

In this Comparative Example, the obtained light-emitting element emitted light whose chromaticity was represented by CIE coordinates of (x, y)=(0.692, 0.310). Note that, in this Comparative Example, the difference between the value of the LUMO level of the light-emitting layer 14R and the value of the HOMO level of the light-emitting layer 14B was 2.52 eV.

Result of Measuring Properties of Light-Emitting Elements Next, external quantum efficiency and lives of the light-emitting elements according to Examples 31 to 34 and Comparative Examples 6 to 8 were measured.

First, values of the HOMO level and the LUMO level were measured for each of the layers of the light-emitting elements, and the differences in HOMO level and LUMO level between the layers were measured. Specifically, a photoelectron yield spectroscopy (PYS) apparatus (AC-3 produced by Riken Keiki Co., Ltd.) was used to determine a value of the HOMO level for each of the layers in the light-emitting elements. Moreover, an ultraviolet spectrum was used to measure a bandgap of each of the layers of the light-emitting elements to determine the value of the LUMO level.

Figure 12:
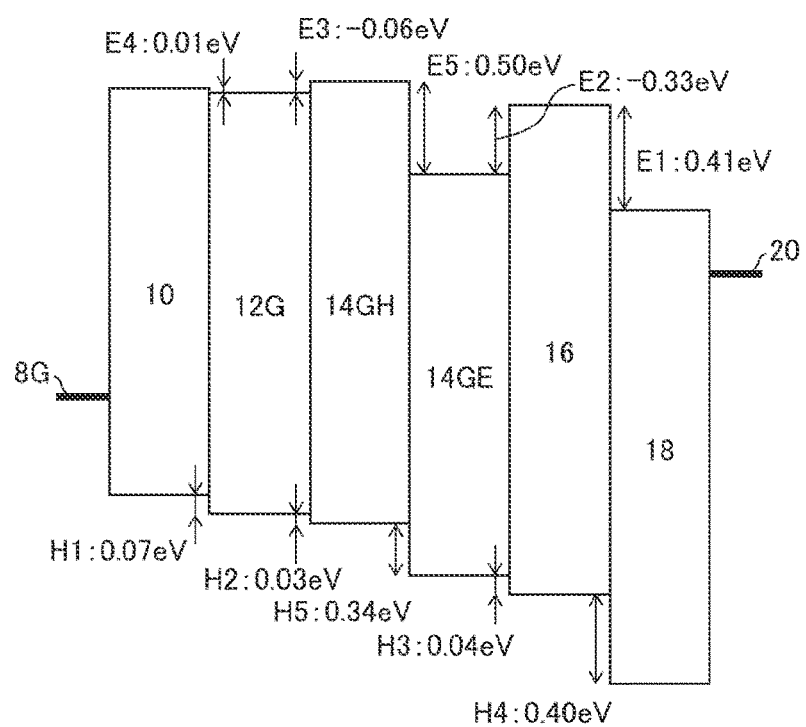
FIG. 12 illustrates an energy diagram showing an example of either a Fermi level of, or a LUMO level and a HOMO level of, each layer in a light-emitting element of the light-emitting device according to Example 33.
Figure 13:
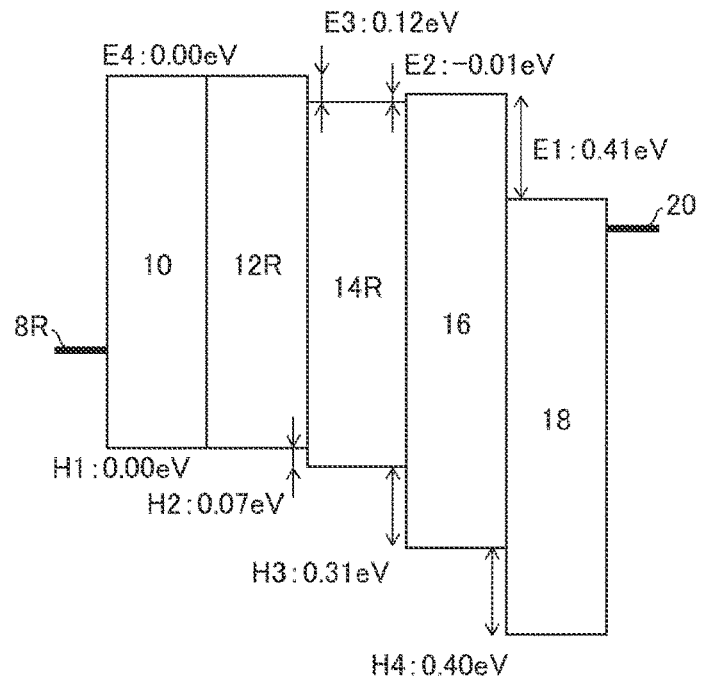
FIG. 13 illustrates an energy diagram showing an example of either a Fermi level of, or a LUMO level and a HOMO level of, each layer in a light-emitting element of the light-emitting device according to Example 34.
Figure 14:
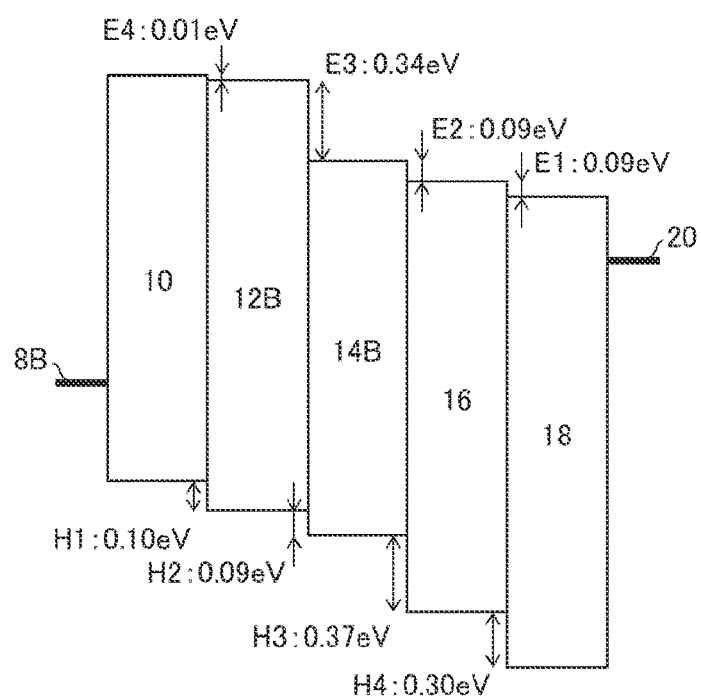
FIG. 14 illustrates an energy diagram showing an example of either a Fermi level of, or a LUMO level and a HOMO level of, each layer in a light-emitting element of a light-emitting device according to Comparative Example 6.
Figure 15:
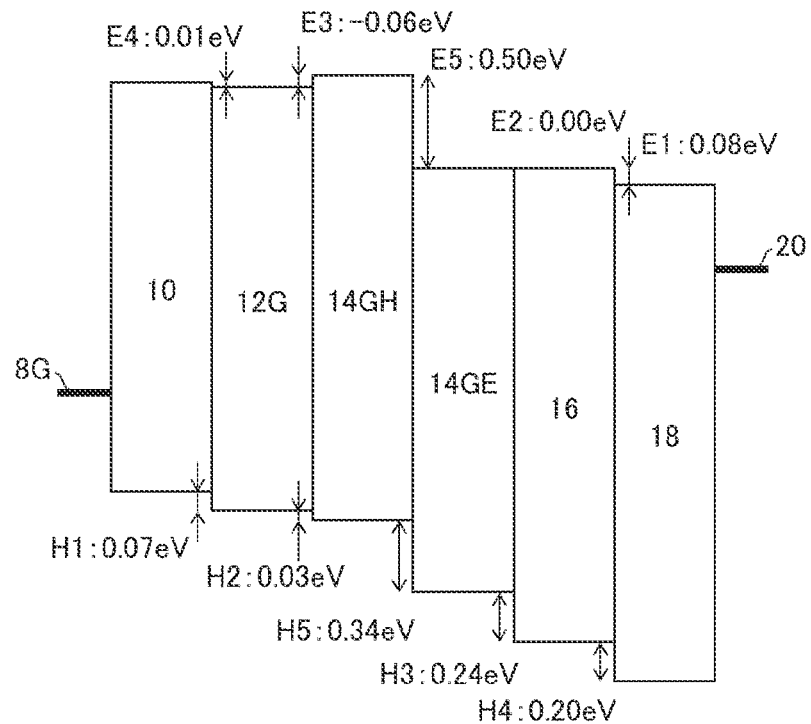
FIG. 15 illustrates an energy diagram showing an example of either a Fermi level of, or a LUMO level and a HOMO level of, each layer in a light-emitting element of the light-emitting device according to Comparative Example 7.

FIG. 10 to FIG. 16 show energy diagrams of the layers of the light-emitting elements according to Examples and Comparative Examples. The energy diagrams represent the results of the above measurement. FIG. 10, FIG. 1, FIG. 12, and FIG. 13 show energy diagrams of the layers of the light-emitting elements according to Example 31, Example 32, Example 33, and Example 34. Moreover, FIG. 14, FIG. 15, and FIG. 15 show energy diagrams of the layers of the light-emitting elements according to Comparative Example 6, Comparative Example 7, and Comparative Example 8.

Next, at an environment temperature of 25° C., a voltage was applied across an electrode of each of the light-emitting elements, and the external quantum efficiency and the life of each electrode were measured. Here, the voltage generated a current having a current density of 10 mA/cm$^2$.

Table 7 below shows the properties of the light-emitting elements according to Examples and Comparative Examples.

TABLE 7

| | Example 31 | Example 32 | COMPARATIVE EXAMPLE 6 | Example 33 | COMPARATIVE EXAMPLE 7 | Example 34 | COMPARATIVE EXAMPLE 8 |
|---|---|---|---|---|---|---|---|
| H1(eV) | 0.10 | 0.10 | 0.10 | 0.07 | 0.07 | 0.00 | 0.00 |
| H2(eV) | 0.09 | 0.08 | 0.09 | 0.03 | 0.03 | 0.07 | 0.07 |
| H3(eV) | 0.27 | 0.28 | 0.37 | 0.04 | 0.24 | 0.31 | 0.46 |
| H4(eV) | 0.40 | 0.40 | 0.30 | 0.40 | 0.20 | 0.40 | 0.20 |
| H5(eV) | | | | 0.34 | 0.34 | | |
| E1 (eV) | 0.41 | 0.41 | 0.09 | 0.41 | 0.08 | 0.41 | 0.23 |
| E2 (eV) | −0.23 | −0.24 | 0.09 | −0.33 | 0.00 | −0.01 | 0.15 |
| E3 (eV) | 0.34 | 0.35 | 0.34 | −0.06 | −0.06 | 0.12 | 0.12 |
| E4 (eV) | 0.01 | 0.01 | 0.01 | 0.01 | 0.01 | 0.00 | 0.00 |
| E5 (eV) | | | | 0.05 | 0.50 | | |
| VOLTAGE (v) | 3.7 | 3.8 | 3.6 | 3.8 | 3.7 | 3.7 | 3.5 |
| EQE(%) | 15.0 | 14.7 | 14.8 | 35.1 | 35.3 | 40.3 | 40.3 |
| LIFE (h) | 2,000 | 2,200 | 900 | 3,100 | 1,800 | 4,300 | 3,200 |

Here, in Table 7, the columns "Example 31" to "Example 34" and "Comparative Example 6" to "Comparative Example 8" show properties of the light-emitting elements according to the respective Examples or Comparative Examples.

In Table 7, the boxes "H1" to "H5" and "E1" to "E5" each show a value of energy from the energy level differences H1 to H5 and from the energy level differences E1 to E5. The values of the energy are represented in eV. Note that, in Examples and Comparative Examples, negative values in boxes of E2 indicate that the value of the LUMO level of the first electron-transport layer 16 is larger than the value of the LUMO level of the light-emitting layer in contact with the first electron-transport layer 16. Note that, in Examples and Comparative Examples, negative values in boxes of E3 indicate that the value of the LUMO level of the second hole-transport layer 12 is smaller than the value of the LUMO level of the light-emitting layer in contact with the second hole-transport layer 12.

In Table 7, the boxes "VOLTAGE" each show a level of voltage required to generate a current having a current density of 10 mA/cm$^2$. The voltages are represented in V. The boxes "EQE" show a percentage of the external quantum efficiency for each of the light-emitting elements when the above voltage was applied. The boxes "LIFE" show a life of each of the light-emitting elements when the above voltage was applied. The lives are represented in hours (h).

Figure 10:
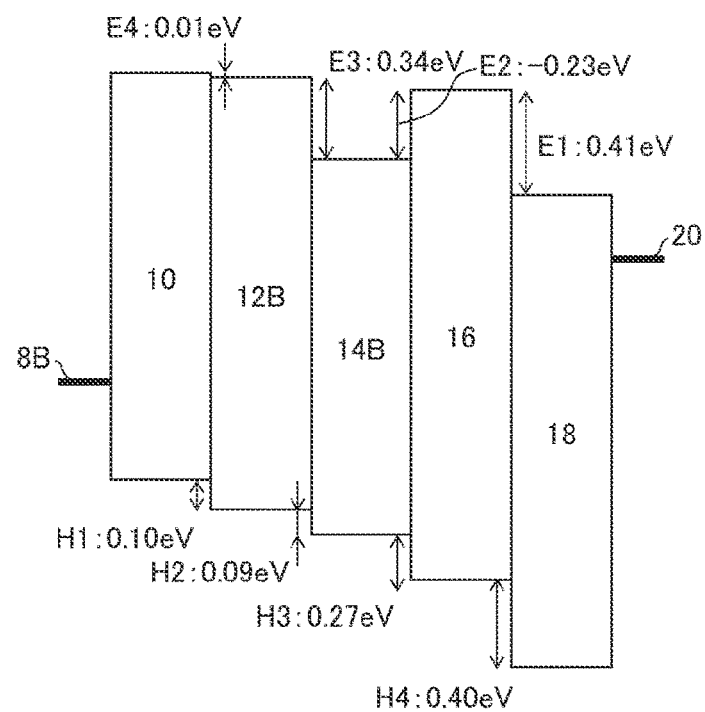
FIG. 10 illustrates an energy diagram showing an example of either a Fermi level of, or a LUMO level and a HOMO level of, each layer in a light-emitting element of the light-emitting device according to Example 31.
Figure 11:
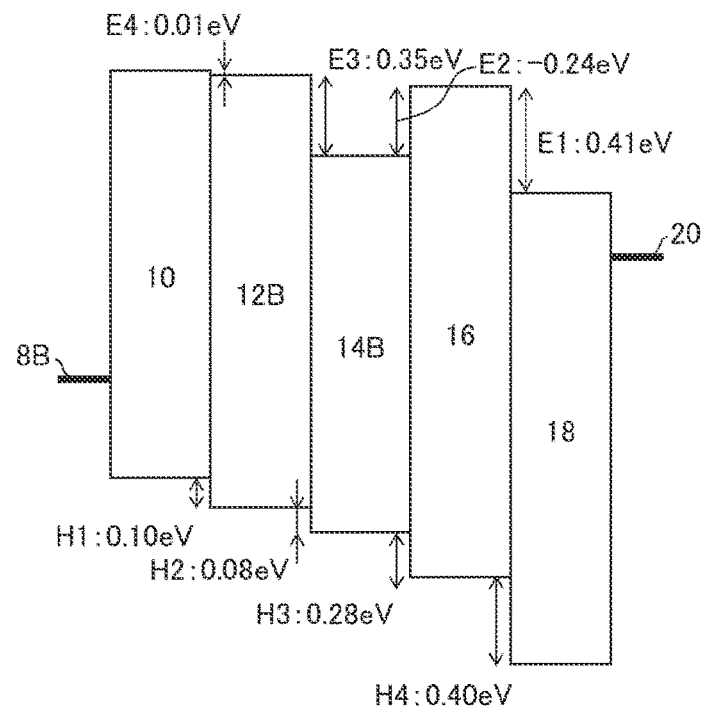
FIG. 11 illustrates an energy diagram showing an example of either a Fermi level of, or a LUMO level and a HOMO level of, each layer in a light-emitting element of the light-emitting device according to Example 32.

As can be clearly seen from Table 7 and FIGS. 10 and 11, for the light-emitting elements according to Examples 31 and 32, the energy level difference E1 is a positive value and the energy level difference E2 is a negative value. Moreover, for both of the light-emitting elements according to Examples 31 and 32, the energy level difference E1 is 0.35 eV or more. Hence, each of the light-emitting elements exhibits a decrease in efficiency in transportation of the electrons from the second electron-transport layer 18 to the first electron-transport layer 16. The increase in electron transportation efficiency reduces excessive electrons, and eventually improves the balance of the carriers, in the light-emitting layer 14B. As a result, the light-emitting elements according to Examples 31 and 32 each have a life of 2,000 hours or longer.

Meanwhile, as clearly seen from Table 7 and FIG. 14, for the light-emitting element according to Comparative Example 6, the energy level difference E2 is a positive value. For the light-emitting element according to Comparative Example 6, the energy level difference E1 is less than 0.35 eV. Hence, each of the light-emitting elements exhibits an increase in efficiency in transportation of the electrons from the second electron-transport layer 18 to the first electron-transport layer 16. The increase in electron transportation efficiency causes excessive electrons, and eventually upsets the balance of the carriers, in the light-emitting layer 14B. As a result, the light-emitting element according to Comparative Example 6 obtains a life of no longer than 1,000 hours.

Likewise, as can be clearly seen from Table 7 and FIG. 12, for the light-emitting element according to Example 33, the energy level difference E1 is a positive value and the energy level difference E2 is a negative value. Moreover, for the light-emitting element according to Example 33, the energy level difference E1 is 0.35 eV or more. Hence, the light-emitting element exhibits a decrease in efficiency in transportation of the electrons from the second electron-transport layer 18 to the first electron-transport layer 16. The decrease in electron transportation efficiency reduces excessive electrons, and thus improves balance of the carriers, in the light-emitting layer 14G. As a result, the light-emitting element according to Example 33 has a life of 3,000 hours or longer.

Meanwhile, as clearly seen from Table 7 and FIG. 15, for the light-emitting element according to Comparative Example 7, the energy level difference E2 is 0.00 eV. Moreover, for the light-emitting element according to Comparative Example 7, the energy level difference E1 is less than 0.35 eV. Hence, the light-emitting element exhibits an increase in efficiency in transportation of the electrons from the second electron-transport layer 18 to the first electron-transport layer 16. The increase in electron transportation efficiency causes excessive electrons, and eventually upsets the balance of the carriers, in the light-emitting layer 14G. As a result, the light-emitting element according to Comparative Example 7 obtains a life of no longer than 2,000 hours.

Likewise, as can be clearly seen from Table 7 and FIG. 13, for the light-emitting element according to Example 34, the energy level difference E1 is a positive value and the energy level difference E2 is a negative value. Moreover, for the light-emitting element according to Example 34, the energy level difference E1 is 0.35 eV or more. Hence, the light-emitting element exhibits a decrease in efficiency in transportation of the electrons from the second electron-transport layer 18 to the first electron-transport layer 16. The decrease in electron transportation efficiency reduces excessive electrons, and thus improves balance of the carriers, in the light-emitting layer 14R. As a result, the light-emitting element according to Example 34 has a life of 4,000 hours or longer.

Figure 16:
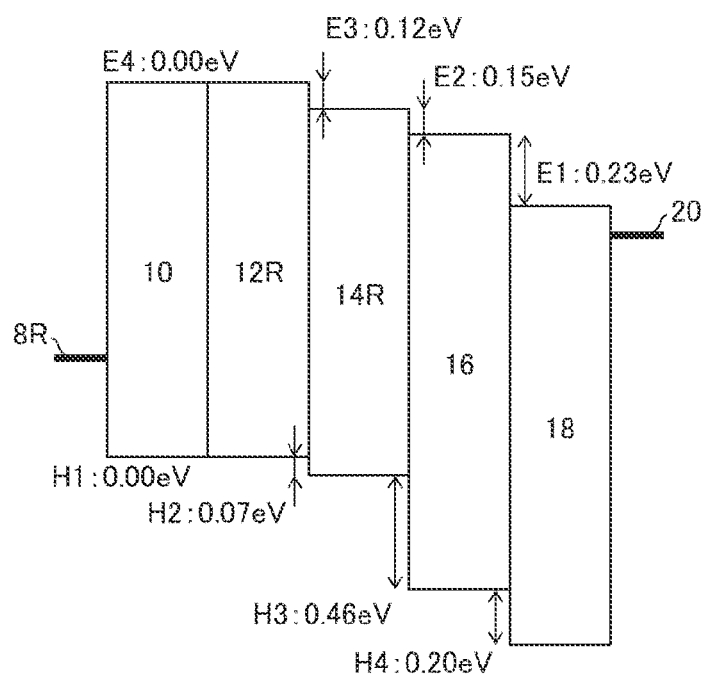
FIG. 16 illustrates an energy diagram showing an example of either a Fermi level of, or a LUMO level and a HOMO level of, each layer in a light-emitting element of the light-emitting device according to Comparative Example 8.

Meanwhile, as clearly seen from Table 7 and FIG. 16, for the light-emitting element according to Comparative Example 8, the energy level difference E2 is a positive value. Moreover, for the light-emitting element according to Comparative Example 8, the energy level difference E1 is less than 0.35 eV. Hence, the light-emitting element exhibits an increase in efficiency in transportation of the electrons from the second electron-transport layer 18 to the first electron-transport layer 16. The increase in electron transportation efficiency causes excessive electrons, and eventually upsets the balance of the carriers, in the light-emitting layer 14R. As a result, the light-emitting element according to Comparative Example 8 obtains a life of no longer than 3,000 hours.

As can be seen, the light-emitting elements according to the Examples 31 to 34 have longer lives than the light-emitting elements according to Comparative Examples 6 to 8.

Second Embodiment

Figure 17:
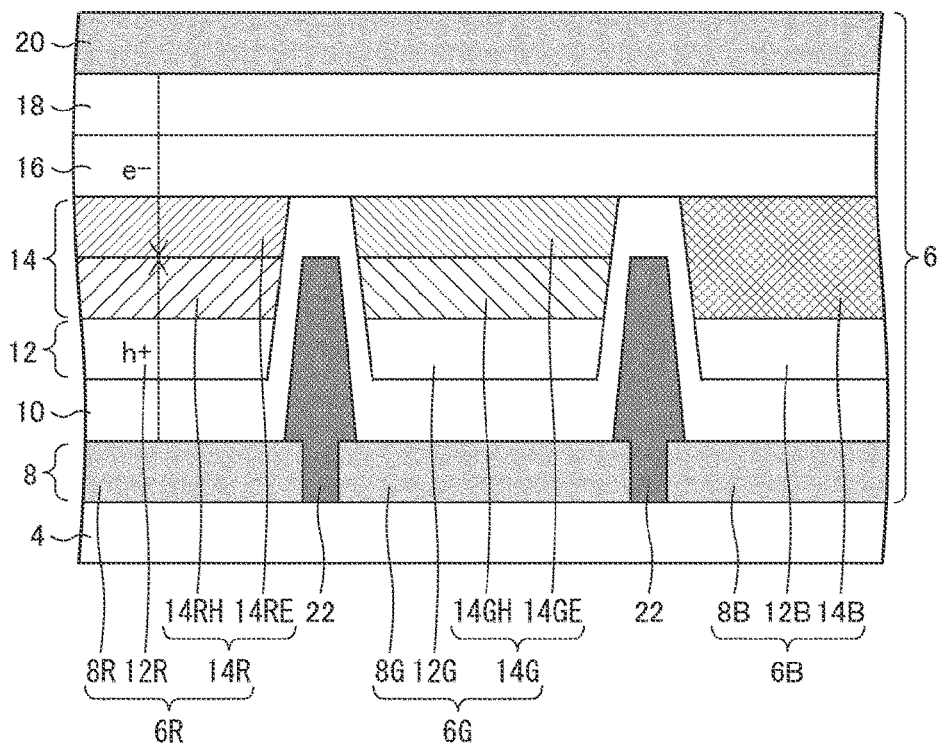
FIG. 17 is a schematic cross-sectional view of the light-emitting device according to a second embodiment of the disclosure.
Figure 18:
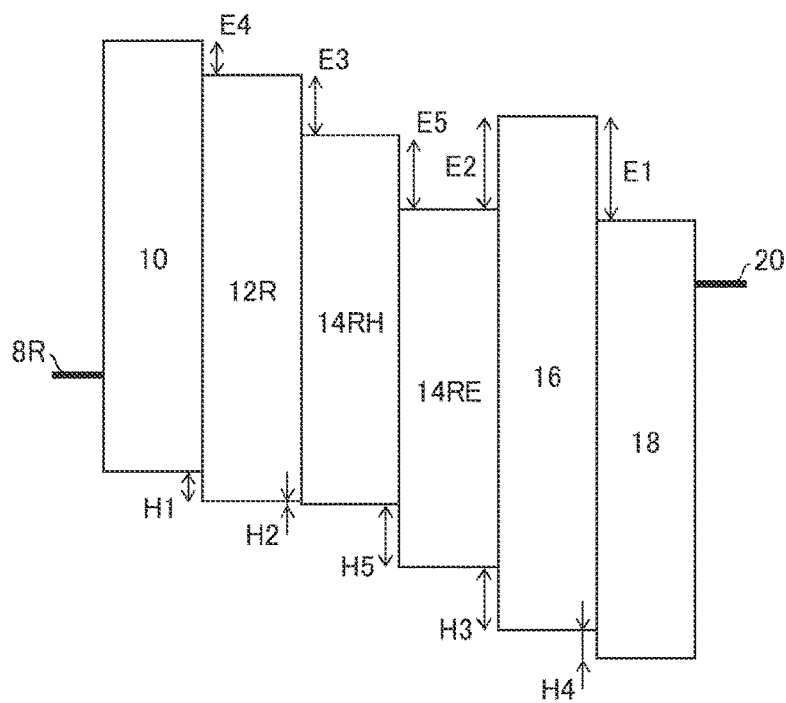
FIG. 18 illustrates an energy diagram showing an example of either a Fermi level of, or a LUMO level and a HOMO level of, each layer in a light-emitting element of the light-emitting device according to the second embodiment of the disclosure.

FIG. 17 is a cross-sectional view of the light-emitting device 2 according to this embodiment. The cross-sectional view in FIG. 17 positionally corresponds to the cross-sectional view in FIG. 1. As illustrated in FIG. 17, the light-emitting device 2 according to this embodiment 5 is different in configuration from the light-emitting device 2 according to the first embodiment in that, in the former light-emitting device 2, the light-emitting layer 14R includes a first light-emitting layer 14RH and a second light-emitting layer 14RE provided from toward the anode 8. Other than the above feature, the light-emitting device 2 according to this embodiment is the same in configuration as the light-emitting device 2 according to the first embodiment.

In this embodiment, the first light-emitting layer 14RH is a red light-emitting layer capable of transporting holes, and the second light-emitting layer 14RE is a red light-emitting layer capable of transporting electrons. The light-emitting element 6R according to this embodiment may be the same in configuration as the light-emitting element 6B except that red light is emitted from the first light-emitting layer 14RH and the second light-emitting layer RE.

In particular, also in this embodiment, the first hole-transport layer 10 contains the polysiloxane-based polymer 24 and the hole-transport material 26. Hence, in the light-emitting device 2 according to this embodiment, the first hole-transport layer 10 is high in thermal resistance to a temperature rise that occurs when the light-emitting elements are driven. Accordingly, the lives of the light-emitting elements increase.

Moreover, a magnitude relationship among the values of the LUMO level and the HOMO level for each of the layers of the light-emitting element 6R may be the same as a magnitude relationship among the values of the LUMO level and the HOMO level for each of the layers of the light-emitting element 6G, as illustrated in the energy band diagram of each of the layers of the light-emitting element 6R according to this embodiment. In particular, also in this embodiment, a value of the LUMO level of the first electron-transport layer 16 is as high as, or higher than, a value of the LUMO level of the second electron-transport layer 18. In either light-emitting element, the energy level difference E1 is 0.35 eV or more. Hence, also in this embodiment, the lives of the light-emitting elements further increase.

The light-emitting device 2 includes the light-emitting elements 6R, 6G, and 6B according to the first and second embodiments. Hence, the life of the light-emitting device 2 further increases. Note that the light-emitting device 2 may have one each of the light-emitting elements 6R, 6G, and 6B included in a corresponding one of a plurality of sub-pixels.

Note that, in the second embodiment, the light-emitting layer 14R is formed in, but not limited to, a multilayer structure including such two layers as the first light-emitting layer 14RH and the second light-emitting layer 14RE. For example, the light-emitting layer 14R may be a single light-emitting layer formed by co-evaporation of three materials such as a hole-transporting material, an electron-transporting material, and a dopant.

The disclosure shall not be limited to the embodiments described above, and can be modified in various manners within the scope of claims. The technical aspects disclosed in different embodiments are to be appropriately combined together to implement another embodiment. Such an embodiment shall be included within the technical scope of the disclosure. Moreover, the technical aspects disclosed in each embodiment may be combined to achieve a new technical feature.

The invention claimed is:

1. A light-emitting element, comprising:
an anode; a cathode; a light-emitting layer between the anode and the cathode; and a hole-transport layer between the anode and the light-emitting layer, wherein the hole-transport layer is a film containing a mixture of a polysiloxane-based polymer and a hole-transport material, and
the polysiloxane-based polymer is either:
a polymer expressed by a general formula (1) or a general formula (2) below,

[Formula 1]

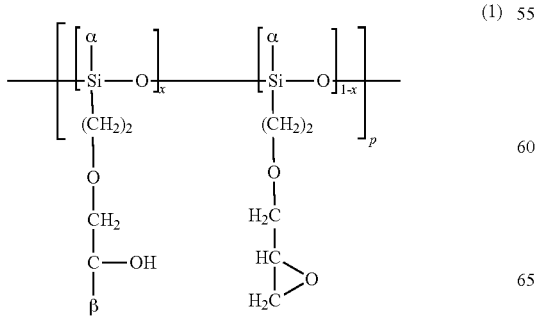

(1)

[Formula 2]

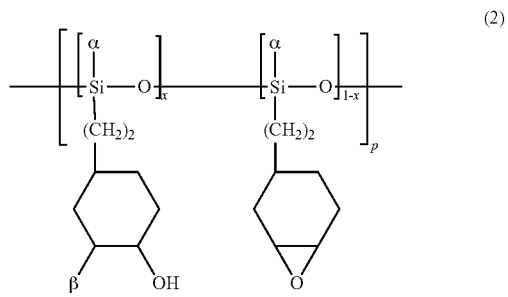

(2)

wherein x is a real number of 0 or more and 1 or less, p is an integer of 1 or more indicating degree of polymerization, a is a hydrogen group, a methyl group, an ethyl group, a methoxy group, an ethoxy group, an alkyl group where C is 3 or more and 6 or less, or an alkoxy group, and β is a saturated alkyl group, an unsaturated alkyl group, or a circular alkyl group where C is 3 or more and 6 or less; or a polymer in which at least one H of the saturated alkyle group β, the unsaturated alkyl group β, or the circular alkyl group β in the general formula (1) or the general formula (2) is replaced with F or Cl.

2. The light-emitting element according to claim 1, wherein the polysiloxane-based polymer is a polymer expressed by a general formula (3) below,

[Formula 3]

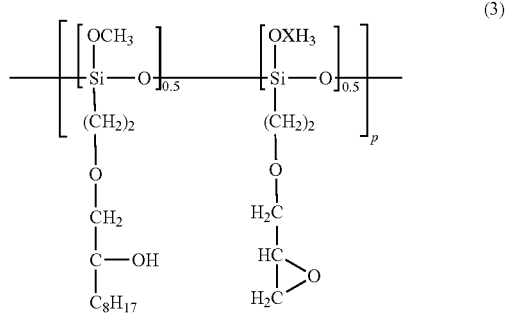

(3)

wherein p is an integer of 1 or more indicating degree of polymerization.

3. The light-emitting element according to claim 1, wherein the polysiloxane-based polymer is a polymer expressed by a general formula (4) below,

[Formula 4]

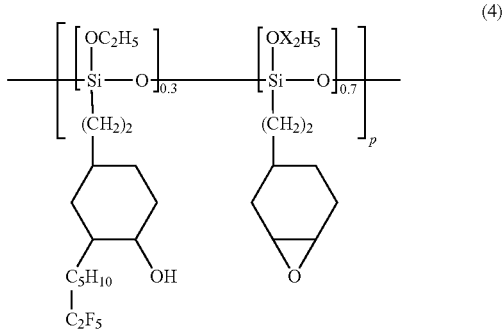

(4)

wherein p is an integer of 1 or more indicating degree of polymerization.

4. The light-emitting element according to claim 1, wherein
the polysiloxane-based polymer has a weight-average molecular weight of 5,000 or more.

5. The light-emitting element according to claim 1, wherein
the polysiloxane-based polymer has a weight-average molecular weight of 65,000 or less.

6. The light-emitting element according to claim 1, wherein
the hole-transport material contains at least one of phenylamine or a carbazole-based compound.

7. The light-emitting element according to claim 1, wherein
the hole-transport material has a phenylamine-based skeleton.

8. The light-emitting element according to claim 1, wherein
the hole-transport material is NPD.

9. The light-emitting element according to claim 1, wherein
a weight ratio of the polysiloxane-based polymer to the hole-transport material is 1 to 1,000 or more and 1 to 1 or less.

10. A light-emitting element, comprising:
an anode; a cathode; and a hole-transport layer, a light-emitting layer, a first electron-transport layer, and a second electron-transport layer sandwiched between the anode and the cathode and provided in a stated order from toward the anode, wherein
a value of a LUMO level of the first electron-transport layer is as high as, or higher than, a value of a LUMO level of the second electron-transport layer, and
the value of the LUMO level of the first electron-transport layer is higher than a value of a LUMO level of the light-emitting layer in contact with the first electron-transport layer.

11. The light-emitting element according to claim 10, wherein
a difference between an energy level of the first electron-transport layer at the LUMO level and an energy level of the second electron-transport layer at the LUMO level is 0.35 eV or more.

12. The light-emitting element according to claim 10, wherein
the light-emitting layer is a single layer provided toward both the anode and the cathode.

13. The light-emitting element according to claim 12, wherein
the hole-transport layer includes: a first hole-transport layer provided toward the anode; and a second hole-transport layer provided toward the cathode.

14. The light-emitting element according to claim 12, wherein
a difference between the value of the LUMO level of the light-emitting layer and a value of a HOMO level of the light-emitting layer is 2.7 eV or more and 3.1 eV or less.

15. The light-emitting element according to claim 10, wherein
the light-emitting layer includes: a first light-emitting layer provided toward the anode and capable of transporting holes; and a second light-emitting layer provided toward the cathode and capable of transporting electrons, the second light-emitting layer being in contact with the first electron-transport layer.

16. The light-emitting element according to claim 15, wherein
a value of a LUMO level of the first light-emitting layer is as high as, or higher than, a value of a LUMO level of the second light-emitting layer, and
a difference between an energy level of the first light-emitting layer at the LUMO level and an energy level of the second light-emitting layer at the LUMO level is 0.25 eV or more.

17. The light-emitting element according to claim 15, wherein
a value of a HOMO level of the second light-emitting layer is as low as, or lower than, a value of a HOMO level of the first light-emitting layer, and
a difference between an energy level of the first light-emitting layer at the HOMO level and an energy level of the second light-emitting layer at the HOMO level is 0.25 eV or more.

18. The light-emitting element according to claim 15, wherein
a value of a HOMO level of the first electron-transport layer is as low as, or lower than, a value of a HOMO level of the second light-emitting layer, and
the difference between an energy level of the first electron-transport layer at the HOMO level and an energy level of the second light-emitting layer at the HOMO level is 0.25 eV or more.

19. The light-emitting element according to claim 15, wherein
a difference between a value of a LUMO level of the second light-emitting layer and a value of a HOMO level of the first light-emitting layer is 2.4 eV or more and 2.7 eV or less.

20. The light-emitting element according to claim 10, wherein
each of the hole-transport layer, the light-emitting layer, the first electron-transport layer, and the second electron-transport layer is an organic layer containing an organic material.

* * * * *